(12) United States Patent
Ma et al.

(10) Patent No.: US 12,154,495 B2
(45) Date of Patent: Nov. 26, 2024

(54) ARRAY BASE PLATE, DISPLAY PANEL AND DISPLAY DEVICE

(71) Applicants: Yunnan Invensight Optoelectronics Technology Co., Ltd., Yunnan (CN); BOE Technology Group Co., Ltd., Beijing (CN)

(72) Inventors: Yaoxi Ma, Beijing (CN); Longfei Fan, Beijing (CN); Pengcheng Lu, Beijing (CN); Shengji Yang, Beijing (CN); Xiaochuan Chen, Beijing (CN); Shanghong Jiang, Beijing (CN); Zhijian Zhu, Beijing (CN); Huaiyun Fan, Beijing (CN)

(73) Assignees: YUNNAN INVENSIGHT OPTOELECTRONICS TECHNOLOGY CO., LTD., Yunnan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/021,438

(22) PCT Filed: Jun. 29, 2022

(86) PCT No.: PCT/CN2022/102501
§ 371 (c)(1),
(2) Date: Feb. 15, 2023

(87) PCT Pub. No.: WO2024/000311
PCT Pub. Date: Jan. 4, 2024

(65) Prior Publication Data
US 2024/0265861 A1   Aug. 8, 2024

(51) Int. Cl.
G09G 3/3225 (2016.01)
G09G 3/3266 (2016.01)
(Continued)

(52) U.S. Cl.
CPC ......... *G09G 3/3225* (2013.01); *G09G 3/3266* (2013.01); *G11C 19/287* (2013.01);
(Continued)

(58) Field of Classification Search
CPC ............... G09G 3/3225; G09G 3/3266; G09G 2300/0852; G09G 2310/0286; G09G 2310/08; G11C 19/287; H10K 59/131
See application file for complete search history.

(56) References Cited

U.S. PATENT DOCUMENTS

2013/0039455 A1   2/2013   Horiuchi et al.
2015/0294636 A1*  10/2015  Yu ........................ G09G 3/3696
                                                              345/204
(Continued)

FOREIGN PATENT DOCUMENTS

CN   102859605 A   1/2013
CN   103927961 A   7/2014
(Continued)

*Primary Examiner* — Rodney Amadiz
(74) *Attorney, Agent, or Firm* — WHDA, LLP

(57) ABSTRACT

An array base plate includes a silicon substrate including multiple cascaded EOA units disposed at a peripheral area; the EOA units are electrically connected to a pixel driving unit; each EOA unit includes an input circuit transmitting a signal input by a light-emitting control signal input line to the EOA unit; a first control circuit transmitting a second power signal input by a second power signal line to a first node, and transmitting a first power signal input by a first power signal line to a second node; a second control circuit transmitting a second clock signal to a third node or transmitting the second power signal to the third node; a pull-up circuit transmitting the first power signal to a light-emitting control signal output line, and a pull-down circuit transmitting the second power signal to the light-emitting control signal output line.

20 Claims, 18 Drawing Sheets

(51) Int. Cl.
*G11C 19/28* (2006.01)
*H10K 59/131* (2023.01)

(52) U.S. Cl.
CPC ... *H10K 59/131* (2023.02); *G09G 2300/0852* (2013.01); *G09G 2310/0286* (2013.01); *G09G 2310/08* (2013.01)

(56) References Cited

U.S. PATENT DOCUMENTS

| | | | |
|---|---|---|---|
| 2016/0189649 A1* | 6/2016 | Xiao | G11C 19/28 345/87 |
| 2017/0061922 A1* | 3/2017 | Wang | G11C 19/188 |
| 2017/0278450 A1* | 9/2017 | Ma | G09G 3/3677 |
| 2018/0204495 A1* | 7/2018 | Wang | G11C 19/287 |
| 2019/0198595 A1 | 6/2019 | Song | |
| 2020/0411778 A1 | 12/2020 | Song et al. | |
| 2021/0074196 A1* | 3/2021 | Feng | G09G 3/20 |
| 2021/0210154 A1* | 7/2021 | Feng | G11C 19/287 |
| 2022/0068212 A1 | 3/2022 | Yao et al. | |
| 2022/0199029 A1 | 6/2022 | Xiao et al. | |
| 2022/0310772 A1 | 9/2022 | Qing et al. | |
| 2022/0343856 A1 | 10/2022 | Yu et al. | |
| 2022/0343859 A1 | 10/2022 | Bai et al. | |
| 2023/0005432 A1 | 1/2023 | Dai et al. | |
| 2023/0245623 A1 | 8/2023 | Dai et al. | |

FOREIGN PATENT DOCUMENTS

| | | |
|---|---|---|
| CN | 106816547 A | 6/2017 |
| CN | 110176215 A | 8/2019 |
| CN | 111816691 A | 10/2020 |
| CN | 112130383 A | 12/2020 |
| CN | 113097263 A | 7/2021 |
| CN | 113724667 A | 11/2021 |
| WO | 2021/184158 A1 | 9/2021 |
| WO | 2021/184160 A1 | 9/2021 |
| WO | 2021/203422 A1 | 10/2021 |
| WO | 2021/243638 A1 | 12/2021 |
| WO | 2021/253392 A1 | 12/2021 |

* cited by examiner

ARRAY BASE PLATE, DISPLAY PANEL AND DISPLAY DEVICE

TECHNICAL FIELD

The present disclosure relates to but is not limited to the technical field of displaying and more particularly, to an array base plate, a display panel and a display device.

BACKGROUND

Micro light-emitting diode (Micro-LED) display devices are miniature display developed in recent years, and a silicon-based OLED miniature display is one of them. The silicon-based OLED micro-display can not only realize the active addressing of pixels, but also realize the preparation of the structures such as a pixel driving circuit and a light-emitting control circuit on the silicon-based substrate, which is conducive to reducing the volume and realizing lightweight.

SUMMARY

The embodiments of the present disclosure employ the following technical solutions:

In one aspect, the present disclosure provides an array base plate, including:
  a silicon substrate, wherein the silicon substrate includes a display area and a peripheral area located on at least one side of the display area, a plurality of EOA units that are cascaded and disposed at the peripheral area, and a plurality of sub-pixels disposed at the display area; wherein at least one of the plurality of sub-pixels includes a pixel driving unit, the EOA units are electrically connected to the pixel driving unit, and each of the plurality of EOA units includes:
    an input circuit, wherein the input circuit is electrically connected to a light-emitting control signal input line and a first clock signal line, the input circuit is configured to transmit a signal input by the light-emitting control signal input line to the EOA unit under the control of the first clock signal input by the first clock signal line;
    a first control circuit, wherein the first control circuit is electrically connected to the input circuit, the first clock signal line, a second clock signal line, a first node, a second node, a first power signal line and a second power signal line, the first control circuit is configured to transmit a second power signal input by the second power signal line to the first node under the control of the first clock signal, and is further configured to transmit a first power signal input by the first power signal line to the second node under the joint control of a signal of the first node and a second clock signal input by the second clock signal line;
    a second control circuit, wherein the second control circuit is electrically connected to the first power signal line, the first node, the second node, the second clock signal line and a third node, the second control circuit is configured to transmit the second clock signal to the third node under the joint control of a signal of the first node and the second clock signal; the second control circuit is further configured to transmit the second power signal to the third node under the control of a signal of the second node;
    a pull-up circuit, wherein the pull-up circuit is electrically connected to the first control circuit, the second control circuit, a light-emitting control signal output line and the third node, and the pull-up circuit is configured to transmit the first power signal to the light-emitting control signal output line under the control of a signal of the third node; and
    a pull-down circuit, wherein the pull-down circuit is electrically connected to the first control circuit, the second control circuit, the second clock signal line, the light-emitting control signal output line and the second node, and the pull-down circuit is configured to transmit the second power signal to the light-emitting control signal output line under the control of the signal of the second node.

In some embodiments of the present disclosure, the input circuit includes a first transistor, the first control circuit includes a second transistor, a third transistor, a fourth transistor and a fifth transistor;
  a gate of the first transistor is electrically connected to the first clock signal line, a first pole of the first transistor is electrically connected to the second node, a second pole of the first transistor is electrically connected to the light-emitting control signal input line;
  a gate of the second transistor is electrically connected to the second node, a first pole of the second transistor is electrically connected to the first clock signal line, a second pole of the second transistor is electrically connected to the first node;
  a gate of the third transistor is electrically connected to the first clock signal line, a first pole of the third transistor is electrically connected to the first node, a second pole of the third transistor is electrically connected to the second power signal line;
  a gate of the fourth transistor is electrically connected to the first node, a first pole of the fourth transistor is electrically connected to the first power signal line, a second pole of the fourth transistor is electrically connected to a first pole of the fifth transistor; and
  a gate of the fifth transistor is electrically connected to the second clock signal line, a second pole of the fifth transistor is electrically connected to the second node.

In some embodiments of the present disclosure, the second control circuit includes a sixth transistor, a seventh transistor, an eighth transistor and a first capacitor:
  a gate of the sixth transistor is electrically connected to the second node, a first pole of the sixth transistor is electrically connected to the first power signal line, a second pole of the sixth transistor is electrically connected to the third node;
  a gate of the seventh transistor is electrically connected to the second clock signal line, a first pole of the seventh transistor is electrically connected to the third node, a second pole of the seventh transistor is electrically connected to a first pole of the eighth transistor,
  a gate of the eighth transistor is electrically connected to the first node, a second pole of the eighth transistor is electrically connected to the second clock signal line; and
  a first electrode of the first capacitor is electrically connected to the first pole of the eighth transistor, a second electrode of the first capacitor is electrically connected to the gate of the eighth transistor.

In some embodiments of the present disclosure, the pull-up circuit includes a ninth transistor and a third capacitor, the pull-down circuit includes a tenth transistor and a second capacitor;
  a gate of the ninth transistor is electrically connected to the third node, a first pole of the ninth transistor is electrically connected to the first power signal line, a second pole of the ninth transistor is electrically connected to the light-emitting control signal output line; a first electrode of the third capacitor is electrically connected to the first pole of the ninth transistor, a second electrode of the third capacitor is electrically connected to the gate of the ninth transistor; and a gate of the tenth transistor is electrically connected to the second node, a first pole of the tenth transistor is electrically connected to the light-emitting control signal output line, a second pole of the tenth transistor electrically connected to the second power signal line; a first electrode of the second capacitor is electrically connected to the gate of the tenth transistor, a second electrode of the second capacitor is electrically connected to the second clock signal line.

In some embodiments of the present disclosure, each of the plurality of EOA units further includes a forward scan transistor and a reverse sweep transistor; the array base plate further includes a forward scan control signal line and a reverse sweep control signal line, a gate of the forward scan transistor is electrically connected to the forward scan control signal line, a gate of the reverse sweep transistor is electrically connected to the reverse sweep control signal line;

a first pole of the forward scan transistor of the EOA unit at a n-th level is electrically connected to the second pole of the first transistor of the EOA unit at a (n+1)-th level, a second pole of the forward scan transistor of the EOA unit at the n-th level is electrically connected to the forward scan signal output line of the EOA unit at the n-th level; and a first pole of the reverse sweep transistor of the EOA unit at the n-th level is electrically connected to the reverse sweep signal output line of the EOA unit at the (n+1)-th level, a second pole of the reverse sweep transistor of the EOA unit at the n-th level is electrically connected to the second pole of the first transistor of the EOA unit at the n-th level.

In some embodiments of the present disclosure, the array base plate includes a power interface between the forward scan transistor and the reverse sweep transistor, and the power interface is configured to electrically connect the first power signal line and the silicon substrate.

In some embodiments of the present disclosure, the first pole of the first transistor is shared with the second pole of the fifth transistor, the second pole of the second transistor is shared with the first pole of the third transistor, the first pole of the fourth transistor is shared with the first pole of the sixth transistor, and the second pole of the seventh transistor is shared with the first pole of the eighth transistor.

In some embodiments of the present disclosure, the ninth transistor includes a plurality of sub-transistors in parallel, and the tenth transistor includes a plurality of sub-transistors in parallel.

In some embodiments of the present disclosure, the first capacitor, the second capacitor and the third capacitor are disposed in a same layer; each capacitor is located at a side of each transistor away from the silicon substrate;

wherein, an orthographic projection of the first capacitor on the silicon substrate overlaps an orthographic projection of the tenth transistor on the silicon substrate; an orthographic projection of the second capacitor on the silicon substrate partially overlaps the orthographic projection of the tenth transistor on the silicon substrate, the orthographic projection of the second capacitor on the silicon substrate partially overlaps an orthographic projection of the ninth transistor on the silicon substrate; an orthographic projection of the third capacitor on the silicon substrate partially overlaps the orthographic projection of the ninth transistor on the silicon substrate.

In some embodiments of the present disclosure, the array base plate includes a semiconductor layer located on the silicon substrate, the semiconductor layer includes an active region, a source region, and a drain region of each transistor of the EOA unit and a first sublayer of the power interface;

the semiconductor layer includes a first portion, a second portion, a third portion, a fourth portion, a fifth portion, a sixth portion, a seventh portion, an eighth portion and a ninth portion that are disposed at intervals with each other;

a connecting line of geometric centers of the first portion and the second portion, a connecting line of geometric centers of the third portion and the fourth portion, and a connecting line of geometric centers of the fifth portion, the sixth portion and the seventh portion are parallel; the fifth portion is located at a side of the third portion away from the first portion, the seventh portion is located at a side of the fourth portion away from the second portion, the sixth portion is located between the fifth portion and the seventh portion; and the ninth portion is located at a side of the eighth portion away from the sixth portion;

the first portion includes the active regions, the source regions and the drain regions of the first transistor and the fifth transistor, the second portion includes the active regions, the source regions and the drain regions of the fourth transistor and the sixth transistor, the third portion includes the active regions, the source regions and the drain regions of the second transistor and the third transistor, the fourth portion includes the active regions, the source regions and the drain regions of the seventh transistor and the eighth transistor; and the fifth portion includes the active region, the source region and the drain region of the reverse sweep transistor, the sixth portion includes the first sublayer of the power interface, the seventh portion includes the active region, the source region and the drain region of the forward scan transistor; the eighth portion includes the active region, the source region and the drain region of the tenth transistor, and the ninth portion includes the active region, the source region and the drain region of the ninth transistor.

In some embodiments of the present disclosure, an area of an orthographic projection of the eighth portion of the semiconductor layer on the silicon substrate is equal to an area of an orthographic projection of the ninth portion on the silicon substrate, and is greater than areas of orthographic projections of the other portions on the silicon substrate.

In some embodiments of the present disclosure, the array base plate further includes a gate layer located at a side of the semiconductor layer away from the silicon substrate;

the gate layer includes the gate of each transistor, an orthographic projection of the gate layer on the silicon substrate partially overlaps an orthographic projection of the semiconductor layer on the silicon substrate; a region of the semiconductor layer overlapping the orthographic projection of the gate layer on the silicon substrate is the active region of each transistor, and a region of the semiconductor layer not overlapping the orthographic projection of the gate layer on the silicon substrate is the source region or the drain region of each transistor;

wherein, the gate of the ninth transistor and the gate of the tenth transistor include a first gate part and four second gate parts, respectively, the second gate parts are disposed at intervals and extend along a same direction, and the four second gate parts are connected in parallel through the first gate part.

In some embodiments of the present disclosure, the tenth transistor includes a first sub-transistor, a second sub-transistor, a third sub-transistor and a fourth sub-transistor that are disposed in parallel;
 the ninth transistor includes a fifth sub-transistor, a sixth sub-transistor, a seventh sub-transistor and an eighth sub-transistor that are disposed in parallel, each second gate part is regarded as the gate of each sub-transistor;
 the eighth portion of the semiconductor layer includes the active regions, the source regions and the drain regions of the first sub-transistor, the second sub-transistor, the third sub-transistor and the fourth sub-transistor;
 the ninth portion of the semiconductor layer includes the active regions, the source regions and the drain regions of the fifth sub-transistor, the sixth sub-transistor, the seventh sub-transistor and the eighth sub-transistor;
 wherein, the source regions of the sub-transistors of the ninth transistor are connected in parallel, the drain regions of the sub-transistors of the ninth transistor are connected in parallel; the source regions of the sub-transistors of the tenth transistor are connected in parallel, the drain regions of the sub-transistors of the tenth transistor are connected in parallel.

In some embodiments of the present disclosure, an area of an orthographic projection of the second gate part on the silicon substrate is greater than an area of an orthographic projection of any one of the gates of the transistors except the gate of the ninth transistor and the gate of the tenth transistor on the silicon substrate.

In some embodiments of the present disclosure, the drain region of the first sub-transistor is shared with the drain region of the second sub-transistor, the source region of the second sub-transistor is shared with the source region of the third sub-transistor, and the drain region of the third sub-transistor is shared with the drain region of the fourth sub-transistor; and
 the drain region of the fifth sub-transistor is shared with the drain region of the sixth sub-transistor, the source region of the sixth sub-transistor is shared with the source region of the seventh sub-transistor, and the drain region of the seventh sub-transistor is shared with the drain region of the eighth sub-transistor.

In some embodiments of the present disclosure, the array base plate further includes a first conductive layer located at a side of the gate layer away from the silicon substrate;
 the first conductive layer includes a first connecting part of which an orthographic projection on the silicon substrate overlapping the source region of each transistor, a second connecting part of which an orthographic projection on the silicon substrate overlapping the drain region of each transistor, and a third connecting part of which an orthographic projection on the silicon substrate overlapping the gate of each transistor; and
 the first connecting part of each transistor is electrically connected to the source region, the second connecting part of each transistor is electrically connected to the drain region, and the third connecting part of each transistor is electrically connected to the gate.

In some embodiments of the present disclosure, the first connecting part of the sixth transistor and the first connecting part of the seventh transistor are an integrated structure, and is connected to the third connecting part of the ninth transistor; the second connecting part of the fourth transistor is electrically connected to the first connecting part of the fifth transistor.

In some embodiments of the present disclosure, the first conductive layer further includes a second sublayer of the power interface, an orthographic projection of the first sublayer of the power interface on the silicon substrate is within an orthographic projection of the second sublayer of the power interface on the silicon substrate, and the first sublayer and the second sublayer are electrically connected.

In some embodiments of the present disclosure, the array base plate further includes a second conductive layer located at a side of the first conductive layer away from the silicon substrate:
 the second conductive layer includes a forward scan auxiliary line, a reverse sweep auxiliary line, a first power auxiliary line, a second power auxiliary line, a first clock auxiliary line and a second clock auxiliary line with a same extension direction;
 the forward scan auxiliary line is electrically connected to the gate of the forward scan transistor and the forward scan control signal line, the reverse sweep auxiliary line is electrically connected to the gate of the reverse sweep transistor and the reverse sweep control signal line; and
 the first power auxiliary line is electrically connected to the source region of the ninth transistor and the second sublayer of the power interface, the second power auxiliary line is electrically connected to the source region of the tenth transistor, the first clock auxiliary line is electrically connected to the gate of the first transistor, and the second clock auxiliary line is electrically connected to the second capacitor.

In some embodiments of the present disclosure, the second conductive layer further includes the reverse sweep signal output line and the light-emitting control signal output line:
 the reverse sweep signal output line of the EOA unit at the n-th level is electrically connected to the reverse sweep transistor of the EOA unit at a (n−1)-th level, the light-emitting control signal output line of the EOA unit at the n-th level is electrically connected to the pixel driving units of at least one line of the sub-pixels; and
 an orthographic projection of the reverse sweep signal output line on the silicon substrate and the orthographic projection of each transistor on the silicon substrate do not overlap with each other, an orthographic projection of the light-emitting control signal output line on the silicon substrate overlaps orthographic projections of the tenth transistor and the ninth transistor on the silicon substrate.

In some embodiments of the present disclosure, the array base plate further includes a third conductive layer located at a side of the second conductive layer away from the silicon substrate;
 the third conductive layer includes the forward scan control signal line, the reverse sweep control signal line, the first power signal line, the second power signal line, the first clock signal line, and the second clock signal line with a same extension direction and arranged along a first direction; the first direction is a direction that the peripheral area points to the display area, and the extension direction of the forward scan control signal line intersects the extension direction of the forward scan auxiliary line; and the first power signal line is electrically connected to the first power auxiliary line, the second power signal line is electrically connected to the second power auxiliary line, the first clock signal line is electrically connected to the first clock auxiliary line, and the second clock signal line is electrically connected to the second clock auxiliary line.

In some embodiments of the present disclosure, the third conductive layer further includes a first source region connecting line, a first drain region connecting line, a second source region connecting line and a second drain region connecting line extending along a second direction; the second direction intersects the first direction;

wherein the first source region connecting line connects the source regions of the first sub-transistor, the second sub-transistor, the third sub-transistor and the fourth sub-transistor in parallel;

the first drain region connecting line connects the drain regions of the first sub-transistor, the second sub-transistor, the third sub-transistor and the fourth sub-transistor in parallel;

the second source region connecting line connects the source regions of the fifth sub-transistor, the sixth sub-transistor, the seventh sub-transistor and the eighth sub-transistor in parallel; and the second drain region connecting line connects the drain regions of the fifth sub-transistor, the sixth sub-transistor, the seventh sub-transistor and the eighth sub-transistor in parallel.

In some embodiments of the present disclosure, the third conductive layer further includes a first forward scan signal input line and a second forward scan signal input line extending along the first direction;

the first pole of the forward scan transistor of the EOA unit at the (n−1)-th level is electrically connected to the second pole of the first transistor of the EOA unit at the n-th level through the second forward scan signal input line; and the first pole of the forward scan transistor of the EOA unit at the n-th level is electrically connected to the second pole of the first transistor of the EOA unit at the (n+1)-th level through the first forward scan signal input line.

In some embodiments of the present disclosure, the array base plate further includes a fourth conductive layer located at a side of the third conductive layer away from the silicon substrate, a fifth conductive layer located at a side of the fourth conductive layer away from the silicon substrate, and a sixth conductive layer located at a side of the fifth conductive layer away from the silicon substrate; and the fifth conductive layer includes the first electrode of the first capacitor, the first electrode of the second capacitor and the first electrode of the third capacitor, and the sixth conductive layer includes the second electrode of the first capacitor, the second electrode of the second capacitor and the second electrode of the third capacitor.

In some embodiments of the present disclosure, the pixel driving unit includes an eleventh transistor, a twelfth transistor, a thirteenth transistor, a fourteenth transistor, a fourth capacitor and a fifth capacitor;

a gate of the eleventh transistor is electrically connected to a reset signal line, a first pole of the eleventh transistor is electrically connected to an anode of a light-emitting device, a second pole of the eleventh transistor is electrically connected to the second power signal line;

a gate of the twelfth transistor is electrically connected to a fourth node, a first pole of the twelfth transistor is electrically connected to a fifth node, a second pole of the twelfth transistor is electrically connected to the anode;

a gate of the thirteenth transistor is electrically connected to the light-emitting control signal output line, a first pole of the thirteenth transistor is electrically connected to the first power signal line, a second pole of the thirteenth transistor is electrically connected to the fifth node;

a gate of the fourteenth transistor is electrically connected to a gate drive signal line, a first pole of the fourteenth transistor is electrically connected to a data line, a second pole of the fourteenth transistor is electrically connected to the fourth node; and a first electrode of the fourth capacitor is electrically connected to the fifth node, a second electrode of the fourth capacitor is electrically connected to the fourth node; a first electrode of the fifth capacitor is electrically connected to the first power signal line, and a second electrode of the fifth capacitor is electrically connected to the fifth node.

In a second aspect, the embodiment of the present disclosure provides a display panel, including the array base plate described as the first aspect.

In a third aspect, the embodiment of the present disclosure provides a display device, including the display panel described as the second aspect.

It should be understood that various aspects of the present disclosure can be implemented separately or in combination with one or more other aspects. It should also be understood that the description and specific embodiments herein are intended to be illustrative only and are not intended to limit the scope of the present disclosure.

The above description is merely a summary of the technical solutions of the present disclosure. In order to more clearly know the technological means of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the drawings that are required to describe the embodiments or the related art will be briefly described below. Apparently, the drawings that are described below are merely embodiments of the present disclosure, and a person skilled in the art may obtain other drawings according to these drawings without paying creative work.

DETAILED DESCRIPTION

Figure 1:
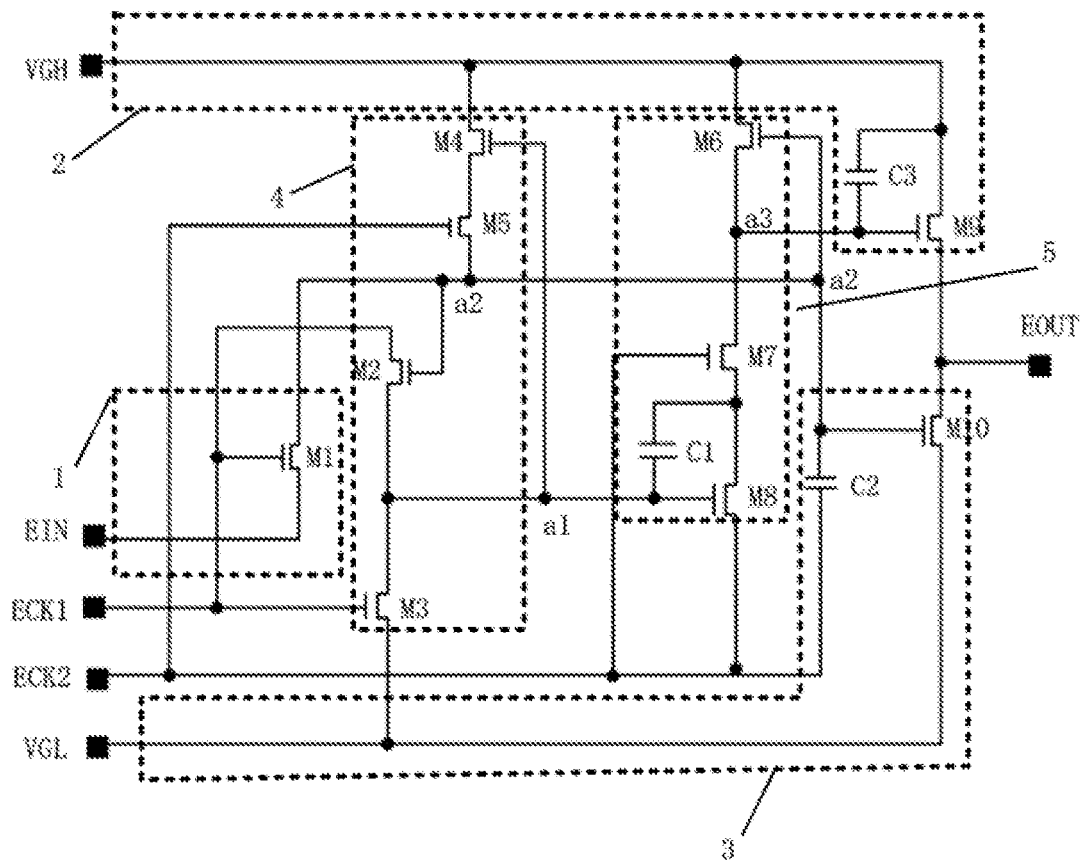
FIG. 1 is a schematic diagram of a circuit structure of a EOA unit according to an embodiment of the present disclosure.

The following will clearly and completely describe the technical solution in the embodiment of the present disclosure in combination with the drawings in the embodiment of the present disclosure. Obviously, the described embodiment is only part of the embodiment of the present disclosure, not all of the embodiments. Based on the embodiments in the present disclosure, all other embodiments obtained by ordinary technicians in the art without creative work fall within the protection scope of the present disclosure.

It should be noted that, unless the context clearly indicates otherwise, the singular form of words used in the specification and the appended claims includes the plural, and vice versa. Therefore, when referring to the singular, it usually includes the plural of the corresponding terms. Similarly, the words "include" and "comprise" will be interpreted as inclusive rather than exclusive. Similarly, the terms "including" and "or" shall be construed as including, unless otherwise stated herein.

In addition, it should be noted that when introducing the elements of the present disclosure and its embodiments, the articles "a", "an". "this" and "the" are intended to indicate the existence of one or more elements. Unless otherwise stated, "a plurality of" means two or more. The terms "include", "comprise", "contain" and "have" are intended to include and indicate that other elements other than those listed may exist. The terms "first", "second" and "third" are only used for descriptive purposes, and cannot be understood as indicating or implying relative importance and formation order.

In addition, in the attached drawings, the thickness of the area and layer may be exaggerated for clarity. The same reference numerals in the figures represent the same or similar structures, so their detailed description will be omitted. In addition, the attached drawing is only a schematic diagram of the present disclosure, and is not necessarily drawn to scale.

Unless the context otherwise requires, the term "including" is interpreted as "including, but not limited to" in the entire specification and claims. In the description of the specification, the terms "one embodiment", "some embodiments", "exemplary embodiments", "examples", "specific examples" or "some examples" are intended to indicate that specific features, structures, materials or characteristics related to the embodiment or example are included in at least one embodiment or example of the present disclosure. The schematic representation of the above terms does not necessarily refer to the same embodiment or example. In addition, the specific features, structures, materials or features described may be included in any one or more embodiments or examples in any appropriate manner.

In the specification, unless otherwise specified and limited, the terms "installation", "connection" and "connecting" shall be understood broadly. For example, it can be fixed connection, removable connection, or integrated connection. It can be mechanical connection or electrical connection. It can be directly connected, indirectly connected through middleware, or connected within two components. For those skilled in the art, the specific meaning of the above terms in the present disclosure can be understood according to the specific situation.

In the specification. "electrically connected" includes the case that the constituent elements are connected together by elements with certain electrical functions. There is no special restriction on "elements with certain electrical functions" as long as they can transmit and receive electrical signals between the constituent elements that can be connected. Examples of "elements with certain electrical functions" include not only electrodes and wiring, but also switching elements such as transistors, resistors, inductors, capacitors, and other elements with various functions.

In the specification, the "disposed in a same layer" adopted refers to the structure formed by two (or more) structures through the same patterning process, and their materials may be the same or different. For example, the materials that form the precursors of multiple structures in the same layer are the same, and the final materials may be the same or different.

Polygons in the specification are not strictly defined, they can be approximate triangles, rectangles, trapeziums, pentagons or hexagons. There can be some small deformations caused by tolerances, such as chamfers, arcs and deformations.

In the specification, "parallel" refers to the state that the angle formed by two straight lines is greater than −10° and less than 10°, so it also includes the state that the angle is greater than −5° and less than 5°. In addition, "perpendicular" refers to the state in which the angle formed by two straight lines is greater than 80° and less than 100°, so it also includes the state in which the angle is greater than 850 and less than 95°.

Exemplary embodiments will now be described more comprehensively with reference to the accompanying drawings.

A silicon-based OLED micro-display is mainly composed of a driver module part (also called array base plate) called silicon-based backplate (BP) and a device part called organic light-emitting diode (OLED). The silicon-based BP part is mainly composed of a pixel driver circuit array, a source driver, a gate driver, an emission control driver, an oscillator (OSC), a gamma register, an interface and a display control module. The OLED device part is mainly composed of OLED, thin file encapsulation (TFE), color filter (CF) and micro lens. Compared with a traditional glass-based BP, the silicon-based BP is conducive to reducing the system volume and realizing lightweight, and is more suitable for display products with high Pixels Per Inch (PPL pixel density unit) and narrow frame.

The embodiment of the present disclosure provides an array base plate, including:

a silicon substrate 100, wherein the silicon substrate 100 includes a display area and a peripheral area located on at least one side of the display area, a plurality of EOA units that are cascaded and disposed at the peripheral area, and a plurality of sub-pixels disposed at the display area; at least one sub-pixel includes a pixel driving unit, the EOA units are electrically connected to the pixel driving unit. Referring to FIG. 1, each of the plurality of EOA units includes:

an input circuit 1, wherein the input circuit 1 is electrically connected to a light-emitting control signal input line EIN and a first clock signal line ECK1, the input circuit is configured to transmit a signal input by the light-emitting control signal input line EIN to the EOA unit under the control of the first clock signal input by the first clock signal line ECK1;

a first control circuit 4, wherein the first control circuit 4 is electrically connected to the input circuit 1, the first clock signal line ECK1, a second clock signal line ECK2, a first node a1, a second node a2, a first power signal line VDD (or VGH) and a second power signal line VSS (or VGL), the first control circuit 4 is configured to transmit a second power signal input by the second power signal line VSS to the first node a1 under the control of the first clock signal, and is further configured to transmit a first power signal input by the first power signal line VDD to the second node a2 under the joint control of a signal of the first node a1 and a second clock signal input by the second clock signal line ECK2;

a second control circuit 5, wherein the second control circuit 5 is electrically connected to the first power signal line VDD, the first node a1, the second node a2, the second clock signal line ECK2 and a third node a3, the second control circuit 5 is configured to transmit the second clock signal to the third node a3 under the joint control of a signal of the first node a1 and the second clock signal; the second control circuit 5 is further configured to transmit the second power signal to the third node a3 under the control of a signal of the second node a2;

a pull-up circuit 2, wherein the pull-up circuit 2 is electrically connected to the first control circuit 4, the second control circuit 5, a light-emitting control signal output line EOUT and the third node a3, and the pull-up circuit 2 is configured to transmit the first power signal to the light-emitting control signal output line EOUT under the control of a signal of the third node a3; and a pull-down circuit 3, wherein the pull-down circuit 3 is electrically connected to the first control circuit 4, the second control circuit 5, the second clock signal line ECK2, the light-emitting control signal output line EOUT and the second node a2, and the pull-down circuit 3 is configured to transmit the second power signal to the light-emitting control signal output line EOUT under the control of the signal of the second node a2.

Among them, the EOA unit refers to the emission control shift register on array, which is used to provide a light-emitting control signal to the pixel driving unit of the sub-pixels in the display area AA, to control the sub-pixels in the display area AA to emit light.

In the exemplary embodiment, the first node a1, the second node a2 and the third node a3 do not exist in fact. They are just a concept provided for the convenience of describing the circuit connection relationship in the EOA unit.

It should be noted that in some embodiments, the above first power signal line VDD may continuously provide high-level voltage signals. In the embodiment of the present disclosure, the power signal lines marked with VDD and VGH represent the first power signal line. The above second power signal line VSS may continuously provide low-level voltage signals. In the embodiment of the present disclosure, the power signal lines marked with VSS and VGL represent the second power signal line. In some embodiments, the second power signal line VSS may be electrically connected to the ground wire GND, so in some descriptions, the second power signal line is marked as GND.

In addition, since the plurality of EOA units are cascaded, in general, the output signal of the EOA unit at a previous level may be used as the input signal of the EOA unit at a next level in addition to being transmitted to the pixel drive circuit in the display area. It can be understood that, the light-emitting control signal output line EOUT of the EOA unit at the previous level may be electrically connected to the light-emitting control signal input line EIN of the EOA unit at the next level.

The display color of each sub-pixel in the above display area is not limited here. In some embodiments, the display color of each sub-pixel in the display area can be the same. For example, all sub-pixels display blue, and for example, all sub-pixels display white. In other embodiments, the display area may include a variety of sub-pixels with different display colors. For example, the display area may include three types of sub-pixels displaying red, blue and green at the same time. For another example, the display area may include four types of sub-pixels that display red, blue, green and white at the same time.

In the embodiment of the present disclosure, by integrating the EOA unit (the emission control shift register on array) into the peripheral area of the silicon substrate of the array base plate, the process of binding the light-emitting control drive IC is omitted, the dependence of the array base plate on the drive IC with higher cost is reduced, and the cost is reduced. At the same time, the design requirements of narrow frame and low power consumption of the display products may be realized.

In the embodiment of the present disclosure, the EOA unit is set in the peripheral area on at least one side of the display area. In some embodiments, the EOA unit may be set in the peripheral area on one side of the display area. In other embodiments, the EOA unit may be set in the peripheral area on the left and right sides of the display area. The details may be determined according to the design requirements of the display product.

In the embodiment of the present disclosure, referring to FIG. 1, the input circuit 1 includes a first transistor M1, the first control circuit 4 includes a second transistor M2, a third transistor M3, a fourth transistor M4 and a fifth transistor M5:
  a gate of the first transistor M1 is electrically connected to the first clock signal line ECK1, a first pole of the first transistor M1 is electrically connected to the second node a2, a second pole of the first transistor M1 is electrically connected to the light-emitting control signal input line EIN;
  a gate of the second transistor M2 is electrically connected to the second node a2, a first pole of the second transistor M2 is electrically connected to the first clock signal line ECK1, a second pole of the second transistor M2 is electrically connected to the first node a1;
  a gate of the third transistor M3 is electrically connected to the first clock signal line ECK1, a first pole of the third transistor M3 is electrically connected to the first node a1, a second pole of the third transistor M3 is electrically connected to the second power signal line VGL;
  a gate of the fourth transistor M4 is electrically connected to the first node a1, a first pole of the fourth transistor M4 is electrically connected to the first power signal line VGH, a second pole of the fourth transistor M4 is electrically connected to a first pole of the fifth transistor M5; and
  a gate of the fifth transistor M5 is electrically connected to the second clock signal line ECK2, a second pole of the fifth transistor M5 is electrically connected to the second node a2.

In the exemplary embodiment, in order to save the design and wiring layout space of the input circuit 1, the second pole of the second transistor M2 and the first pole of the third transistor M3 may be electrically connected together and then connected to the first node a1. For example, when designing the layout positions of the second transistor M2 and the third transistor M3, the positions of them may be arranged to be adjacent, and the second pole of the second transistor M2 and the first pole of the third transistor M3 may be set as an integrated structure, or the second pole of the second transistor M2 may be shared with the first pole of the third transistor M3.

Certainly, the second pole of the fifth transistor M5 and the first pole of the first transistor M1 may be electrically connected together and then connected to the second node a2. For example, when designing the layout positions of the fifth transistor M5 and the first transistor M1, the positions of them may be arranged to be adjacent, and the second pole of the fifth transistor M5 and the first pole of the first transistor M1 may be set as an integrated structure, and even the second pole of the fifth transistor M5 may be shared with the first pole of the first transistor M1.

In some embodiments, the second pole of the fourth transistor M4 may be shared with the first pole of the fifth transistor M5. In the embodiment of the present disclosure, referring to FIG. 1, the second control circuit 5 includes a sixth transistor M6, a seventh transistor M7, an eighth transistor M8 and a first capacitor C1;
  a gate of the sixth transistor M6 is electrically connected to the second node a2, a first pole of the sixth transistor M6 is electrically connected to the first power signal line VGH, a second pole of the sixth transistor M6 is electrically connected to the third node a3;
  a gate of the seventh transistor M7 is electrically connected to the second clock signal line ECK2, a first pole of the seventh transistor M7 is electrically connected to the third node a3, a second pole of the seventh transistor M7 is electrically connected to a first pole of the eighth transistor M8;
  a gate of the eighth transistor M8 is electrically connected to the first node a1, a second pole of the eighth transistor M8 is electrically connected to the second clock signal line ECK2; and
  a first electrode of the first capacitor C1 is electrically connected to the first pole of the eighth transistor M8, a second electrode of the first capacitor C1 is electrically connected to the gate of the eighth transistor M8.

In the exemplary embodiment, in order to save the design and wiring layout space of the EOA unit, the first pole of the sixth transistor M6 and the first pole of the fourth transistor M4 may be electrically connected together and then connected to the first power signal line VGH. For example, the first pole of the sixth transistor M6 and the first pole of the fourth transistor M4 may be set as an integrated structure. For another example, the structure of the first pole of the sixth transistor M6 may be shared with that of the first pole of the fourth transistor M4.

In some embodiments, the second pole of the seventh transistor M7 may be shared with the first pole of the eighth transistor M8. In the embodiment of the present disclosure, referring to FIG. 1, the pull-up circuit 2 includes a ninth transistor M9 and a third capacitor C3, the pull-down circuit 3 includes a tenth transistor M10 and a second capacitor C2;

a gate of the ninth transistor M9 is electrically connected to the third node a3, a first pole of the ninth transistor M9 is electrically connected to the first power signal line VGH, a second pole of the ninth transistor M9 is electrically connected to the light-emitting control signal output line EOUT; a first electrode of the third capacitor C3 is electrically connected to the first pole of the ninth transistor M9, a second electrode of the third capacitor C3 is electrically connected to the gate of the ninth transistor M9; and a gate of the tenth transistor M10 is electrically connected to the second node a2, a first pole of the tenth transistor M10 is electrically connected to the light-emitting control signal output line EOUT, a second pole of the tenth transistor M10 is electrically connected to the second power signal line VGL; a first electrode of the second capacitor C2 is electrically connected to the gate of the tenth transistor M10, a second electrode of the second capacitor C2 is electrically connected to the second clock signal line ECK2.

In practical applications, since the functions of the ninth transistor M9 and the tenth transistor M10 is to control the output signal to be pulled up or the output signal to be pulled down. The requirements for the driving capacity of the ninth transistor M9 and the tenth transistor M10 are high. In some embodiments, the dimensions of the ninth transistor M9 and the tenth transistor M10 may be set to be larger than those of other transistors.

The capacitance values of the first capacitor C1, the second capacitor C2 and the third capacitor C3 are not limited here, which may be determined according to the actual situation.

Figure 9:
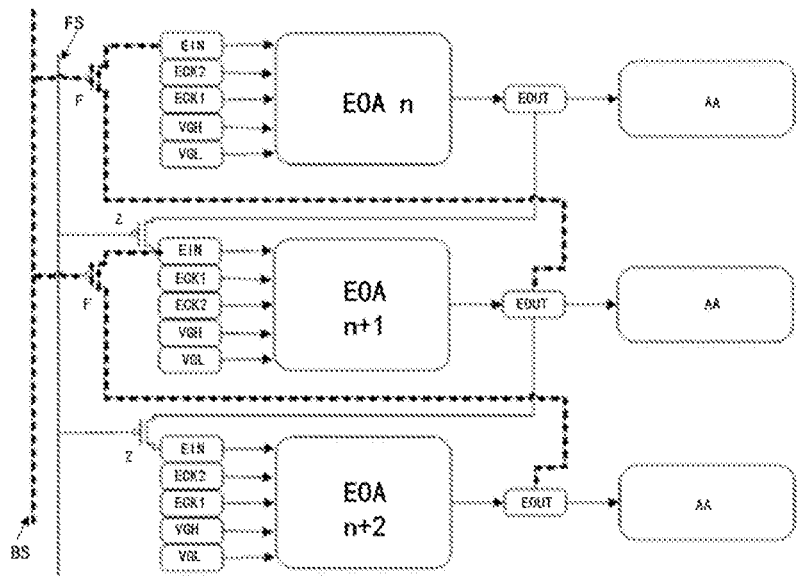
FIG. 9 is a schematic diagram of a cascade circuit of the EOA unit in FIG. 1.
Figure 34:
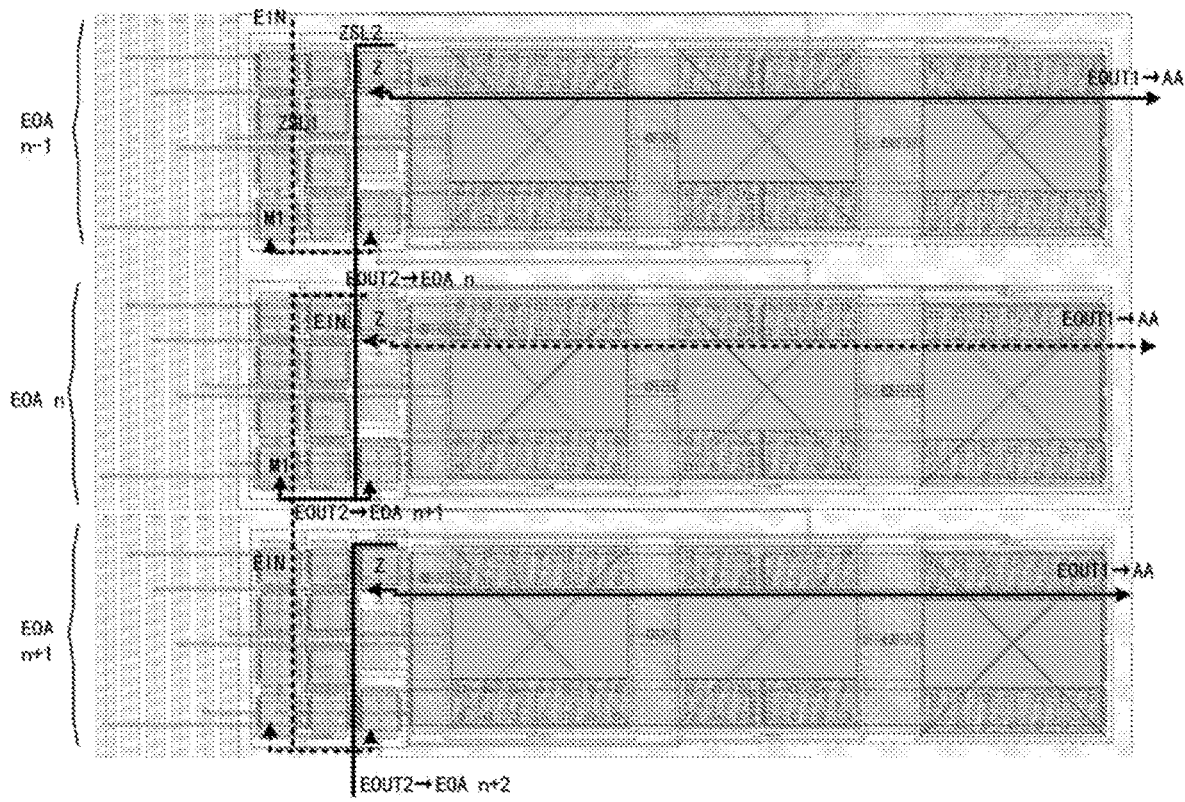
FIG. 34 is a schematic diagram of signal transmission of an array base plate when forward scanning according to an embodiment of the present disclosure.
Figure 35:
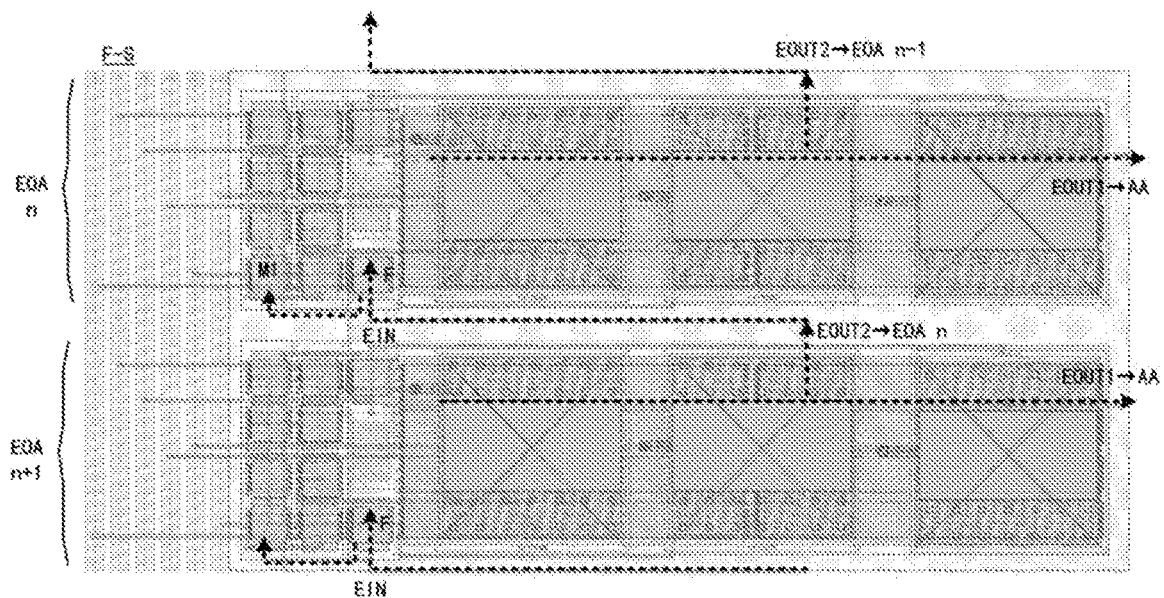
FIG. 35 is a schematic diagram of signal transmission of an array base plate when reverse sweeping according to an embodiment of the present disclosure.

In the embodiment of the present disclosure, referring to FIG. 9, each of the plurality of EOA units further includes a forward scan transistor Z and a reverse sweep transistor F; the array base plate further includes a forward scan control signal line FS and a reverse sweep control signal line BS, a gate of the forward scan transistor Z is electrically connected to the forward scan control signal line FS, a gate of the reverse sweep transistor F is electrically connected to the reverse sweep control signal line BS;

combining FIG. 9 and FIG. 34, a first pole of the forward scan transistor Z of the EOA unit at a n-th level is electrically connected to the second pole of the first transistor M1 of the EOA unit at a (n+1)-th level, a second pole of the forward scan transistor Z of the EOA unit at the n-th level is electrically connected to the forward scan signal output line of the EOA unit at the n-th level; and combining FIG. 9 and FIG. 35, a first pole of the reverse sweep transistor F of the EOA unit at the n-th level is electrically connected to the reverse sweep signal output line of the EOA unit at the (n+1)-th level, a second pole of the reverse sweep transistor F of the EOA unit at the n-th level is electrically connected to the second pole of the first transistor M1 of the EOA unit at the n-th level.

In some embodiments, the above first transistor M1 to the tenth transistor M10, the forward scan transistor Z and the reverse sweep transistor F may all be N-type transistors. In some other embodiments, the above first transistor M1 to the tenth transistor M10, the forward scan transistor Z and the reverse sweep transistor F may all be P-type transistors. Using the same type of transistors in the array base plate can simplify the process flow, reduce the process difficulty of the array base plate and improve the yield of products.

In the exemplary embodiment, the display panel prepared by the array base plate may be controlled to scan line by line from a first line to a n-th line (the value of n is a positive integer), that is, from top to bottom, through the forward scan transistor Z. When the display panel has the rotation function and displays after being rotated by about 180°, the display panel prepared by the array base plate may be controlled to scan line by line from the n-th line to the first line, that is, from bottom to top, through the reverse sweep transistor F, which widens the application scenario of the display panel prepared by the array base plate, for example, it can be applied to commercial display products or billboards with the rotation function.

Figure 2:
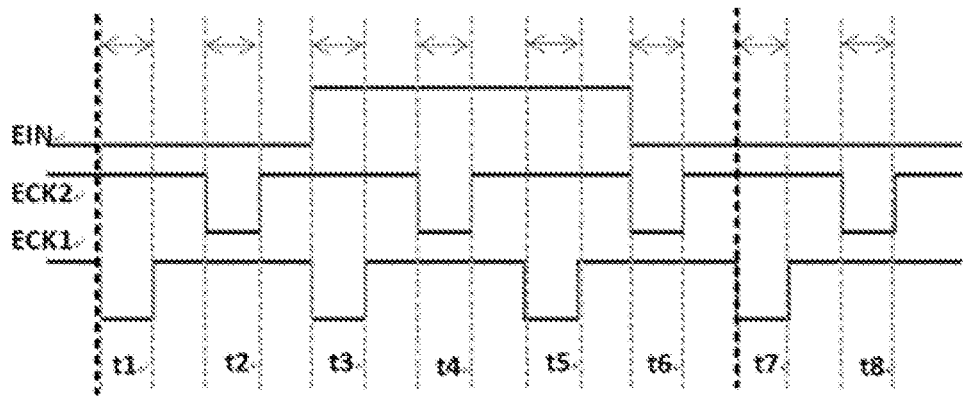
FIG. 2 is a sequence diagram of a working process of the EOA unit in FIG. 1.

FIG. 2 is a sequence diagram of signals driving the EOA circuit in FIG. 1. As shown in FIG. 2, the working process of the EOA circuit includes six stages.

Taking all the transistors in a 10T3C structure shown in FIG. 1 being P-type transistors as an example, the working process of the EOA circuit in FIG. 2 will be explained in combination with FIG. 1.

As shown in FIG. 2, in a first stage t1, inputting a low-level input signal to the light-emitting control signal input line EIN, inputting a low-level first clock signal to the first clock signal line ECK1, and inputting a high-level second clock signal to the second clock signal line ECK2.

Figure 3:
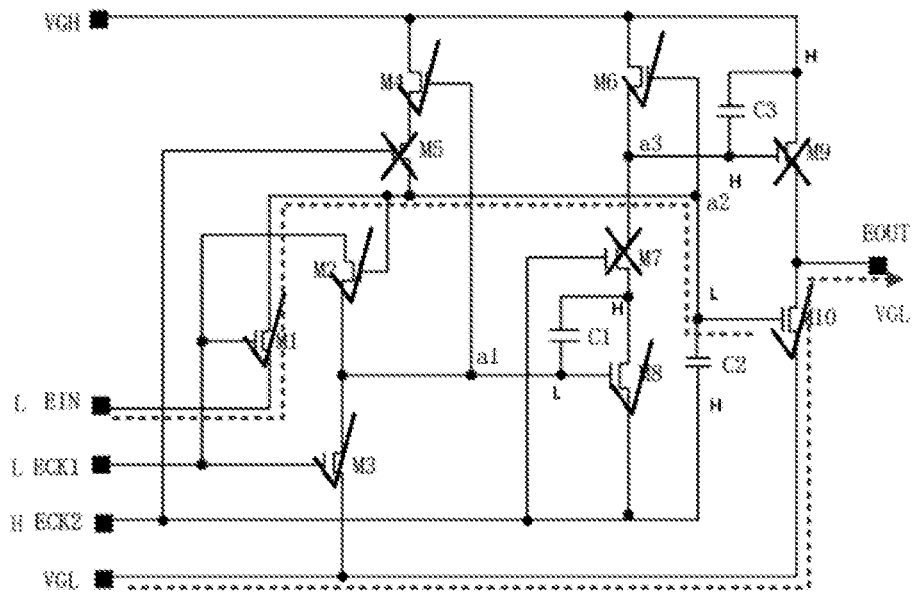
FIG. 3 to FIG. 8 are illustration diagrams of working principles of the EOA unit in FIG. 1 under six working stages.

In the first stage t1, as shown in FIG. 3, inputting the low-level first clock signal to the first clock signal line ECK1, and inputting the low-level input signal to the light-emitting control signal input line EIN, wherein the first transistor M1 and the third transistor M3 are on, a signal at a position of the first node a1 is a low-level signal L, the fourth transistor M4 and the eighth transistor M8 are on, a signal at a position of the second node a2 is the low-level signal L, the second transistor M2, the sixth transistor M6 and the tenth transistor M10 are on; inputting the high-level second clock signal to the second clock signal line ECK2, wherein the fifth transistor M5 and the seventh transistor M7 are cut-off. Because the sixth transistor M6 is on, a signal at a position of the third node a3 is a high-level signal H, the ninth transistor M9 is cut-off, and the second power signal input by the second power signal line VGL is transmitted to the light-emitting control signal output line EOUT through the tenth transistor M10. At this time, the output signal is the low-level second power signal.

As shown in FIG. 2, in a second stage t2, inputting the low-level input signal to the light-emitting control signal input line EIN, inputting the high-level first clock signal to the first clock signal line ECK1, and inputting the low-level second clock signal to the second clock signal line ECK2.

Figure 4:
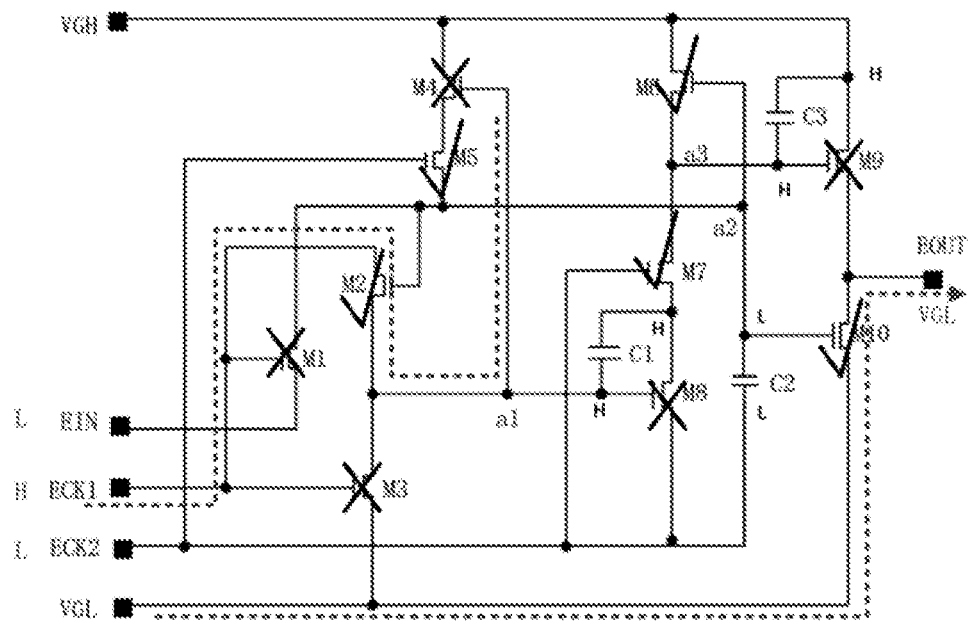

In the second stage t2, as shown in FIG. 4, inputting the high-level first clock signal to the first clock signal line ECK1, wherein the first transistor M1 and the third transistor M3 are cut-off, inputting the low-level second clock signal to the second clock signal line ECK2, wherein the fifth transistor M5 and the seventh transistor M7 are on, the signal at the position of the first node a1 is the high-level signal H, the fourth transistor M4 and the eighth transistor M8 are cut-off, and the signal at the position of the second node a2 is the low-level signal L, the second transistor M2, the sixth transistor M6 and the tenth transistor M10 are on; the signal at the position of the third node a3 is the high-level signal H, the ninth transistor M9 is cut-off, the second power signal input by the second power signal line VGL is transmitted to the light-emitting control signal output line EOUT through the tenth transistor M10. At this time, the output signal is the low-level second power signal.

As shown in FIG. 2, in a third stage t3, inputting a high-level input signal to the light-emitting control signal input line EIN, inputting the low-level first clock signal to the first clock signal line ECK1, and inputting a high-level second clock signal to the second clock signal line ECK2.

Figure 5:
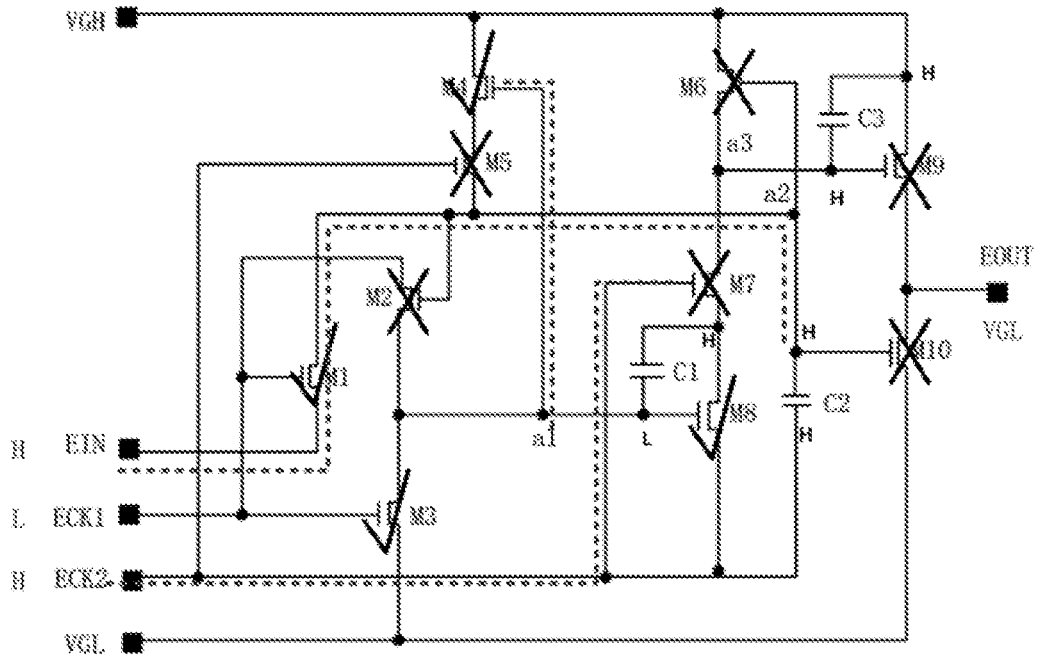

In the third stage t3, as shown in FIG. 5, inputting the low-level first clock signal to the first clock signal line ECK1, wherein the first transistor M1 and the third transistor M3 are on, inputting the high-level second clock signal to the second clock signal line ECK2, wherein the fifth transistor M5 and the seventh transistor M7 are cut-off; the signal at the position of the first node a1 is the low-level signal L, the fourth transistor M4 and the eighth transistor M8 are on; the signal at the position of the second node a2 is the high-level signal H, the second transistor M2, the sixth transistor M6 and the tenth transistor M10 are cut-off; the signal at the position of the third node a3 is the high-level signal H, the ninth transistor M9 is cut-off. Since there is a parasitic capacitor on the output line, which can keep the potential, the light-emitting control signal output line EOUT keeps the output signal of the previous stage. At this time, the output signal is the low-level second power signal.

As shown in FIG. 2, in a fourth stage t4, inputting the high-level input signal to the light-emitting control signal input line EIN, inputting the high-level first clock signal to the first clock signal line ECK1, and inputting the low-level second clock signal to the second clock signal line ECK2.

Figure 6:
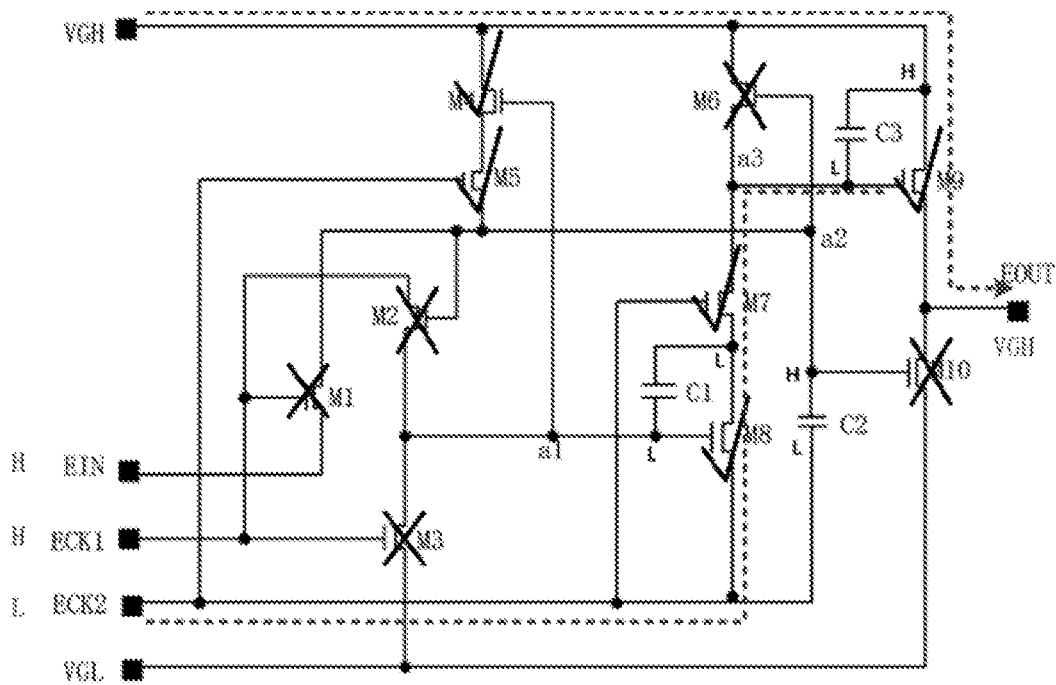

In the fourth stage t4, as shown in FIG. 6, inputting the high-level first clock signal to the first clock signal line ECK1, wherein the first transistor M1 and the third transistor M3 are cut-off, inputting the low-level second clock signal to the second clock signal line ECK2, wherein the fifth transistor M5 and the seventh transistor M7 are on; the signal at the position of the first node a1 is the low-level signal L, the fourth transistor M4 and the eighth transistor M8 are on; the signal at the position of the second node a2 is the high-level signal H, the second transistor M2, the sixth transistor M6 and the tenth transistor M10 are cut-off; the signal at the position of the third node a3 is the low-level signal L, the ninth transistor M9 is on, the first power signal input by the first power signal line VGH is transmitted to the light-emitting control signal output line EOUT through the ninth transistor M9. At this time, the output signal is the high-level first power signal.

As shown in FIG. 2, in a fifth stage t5, inputting the high-level input signal to the light-emitting control signal input line EIN, inputting the low-level first clock signal to the first clock signal line ECK1, and inputting the high-level second clock signal to the second clock signal line ECK2.

Figure 7:
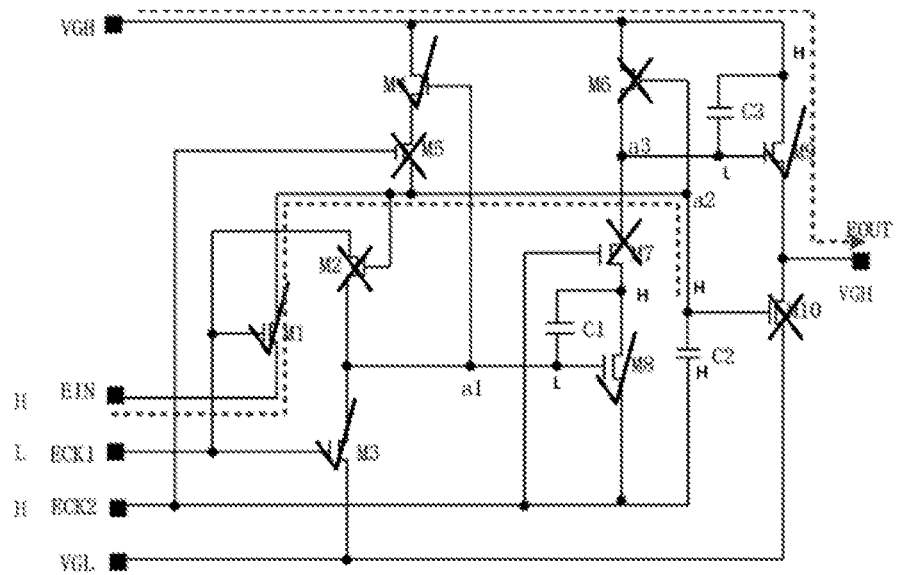

In the fifth stage t5, as shown in FIG. 7, inputting the low-level first clock signal to the first clock signal line ECK1, wherein the first transistor M1 and the third transistor M3 are on, inputting the high-level second clock signal to the second clock signal line ECK2, wherein the fifth transistor M5 and the seventh transistor M7 are cut-off; the signal at the position of the first node a1 is the low-level signal L, the fourth transistor M4 and the eighth transistor M8 are on; the signal at the position of the second node a2 is the high-level signal H, the second transistor M2, the sixth transistor M6 and the tenth transistor M10 are cut-off; the signal at the position of the third node a3 keeps the low-level signal L of the previous stage, the ninth transistor M9 is on, the first power signal input by the first power signal line VGH is transmitted to the light-emitting control signal output line EOUT through the ninth transistor M9. At this time, the output signal is the high-level first power signal.

As shown in FIG. 2, in a sixth stage t6, inputting the low-level input signal to the light-emitting control signal input line EIN, inputting the high-level first clock signal to the first clock signal line ECK1, and inputting the low-level second clock signal to the second clock signal line ECK2.

Figure 8:
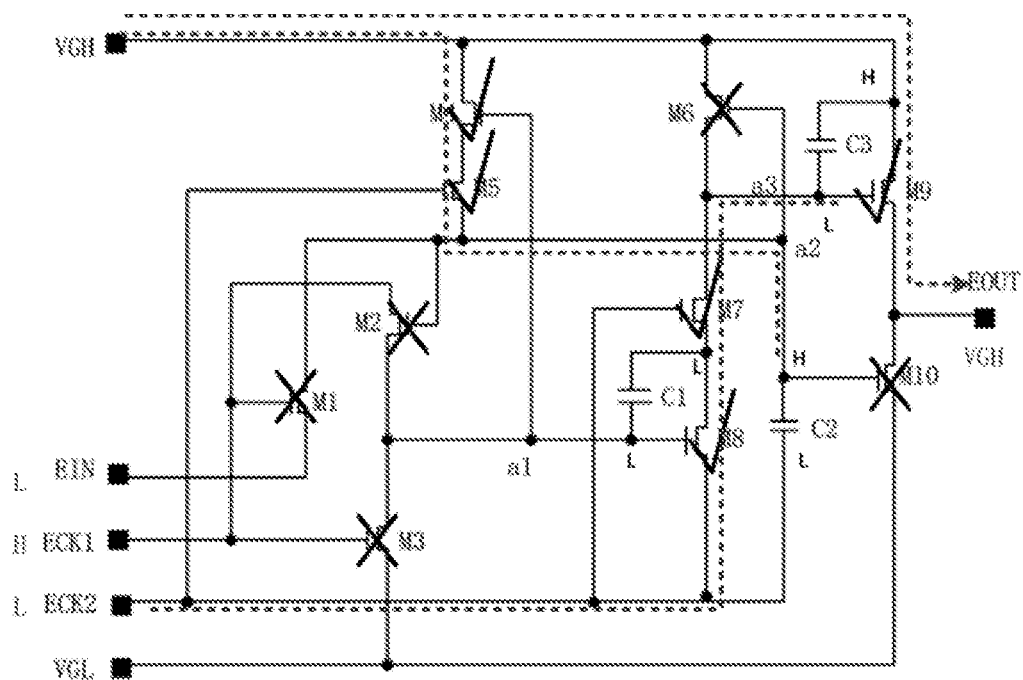

In the sixth stage t6, as shown in FIG. 8, inputting the high-level first clock signal to the first clock signal line ECK1, wherein the first transistor M1 and the third transistor M3 are cut-off, and inputting the low-level second clock signal to the second clock signal line ECK2, wherein the fifth transistor M5 and the seventh transistor M7 are on; the signal at the position of the first node a1 keeps the low-level signal L of the previous stage, the fourth transistor M4 and the eighth transistor M8 are on. Since the fourth transistor M4 and the fifth transistor M5 are on at the same time, the signal at the position of the second node a2 is the high-level signal H, the second transistor M2, the sixth transistor M6 and the tenth transistor M10 are cut-off. Since the seventh transistor M7 and the eighth transistor M8 are on, the signal at the position of the third node a3 is the low-level signal L, the ninth transistor M9 is on, the first power signal input by the first power signal line VGH is transmitted to the light-emitting control signal output line EOUT through the ninth transistor M9. At this time, the output signal is the high-level first power signal.

The seventh stage t7 as shown in FIG. 2 is the process of the first stage t1, and the eighth stage t8 as shown in FIG. 2 is the process of the second stage t2, so as to realize progressive scanning of the sub-pixels.

It should be noted that, in practical applications, the above transistors may also be the N-type transistors. When the above transistors are the N-type transistors, the signal sequence diagram of the EOA circuit is opposite to the sequence signal in FIG. 2.

In an exemplary embodiment, one line or one of the EOA circuits may drive the pixel driving units of at least one line of sub-pixels (pixel driving circuit) at the same time. For example, one line or one of the EOA circuits may drive the pixel driving units of two lines of sub-pixels at the same time, and another example, one line or one of the EOA circuits may drive the pixel driving units of three lines of sub-pixels at the same time.

It should be noted that, in FIG. 3 to FIG. 8, the mark "x" represents that the transistor is in the cut-off state, and the mark "√" represents that the transistor is in the on state. In addition, at the nodes (such as the first node a1, the second node a2 and the third node a3) of the EOA circuit and at the positions of the electrodes of the components (such as the first pole or the second pole of the transistor, the first electrode or the second electrode of the capacitor), the mark "H" represents that the signal at this position is a high-level signal, the mark "L" represents that the signal at this position is a low-level signal. The high and low here only indicate the relative size relationship between the input voltage signals.

Figure 16:
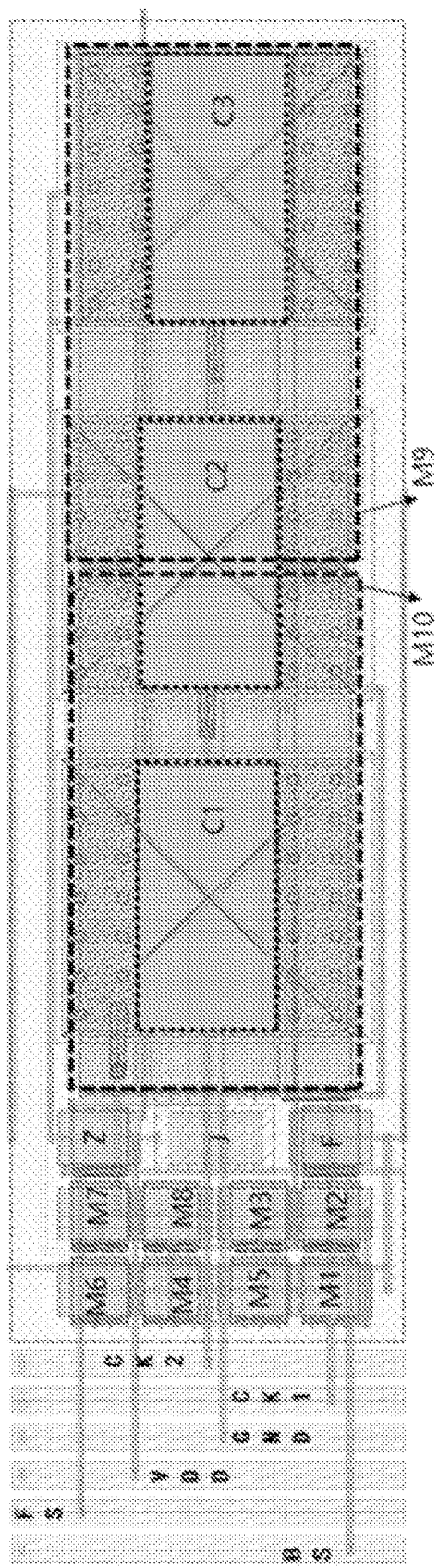
FIG. 16 is a design layout of EOA units on an array base plate according to an embodiment of the present disclosure.

In some embodiments of the present disclosure, referring to FIG. 16, the array base plate includes a power interface J between the forward scan transistor Z and the reverse sweep transistor F, and the power interface J is configured to electrically connect the first power signal line VDD and the silicon substrate 100.

It should be noted that, the first power signal line VDD (or VGH) is the power line that provides continuous high-level signals, and the second power signal line is the power line that provides continuous low-level signals. In the EOA circuit design layout of FIG. 16 to FIG. 35, taking the second power signal line VSS being electrically connected to the ground wire GND or the second power signal line being the ground wire GND as an example to illustrate.

Figure 10:
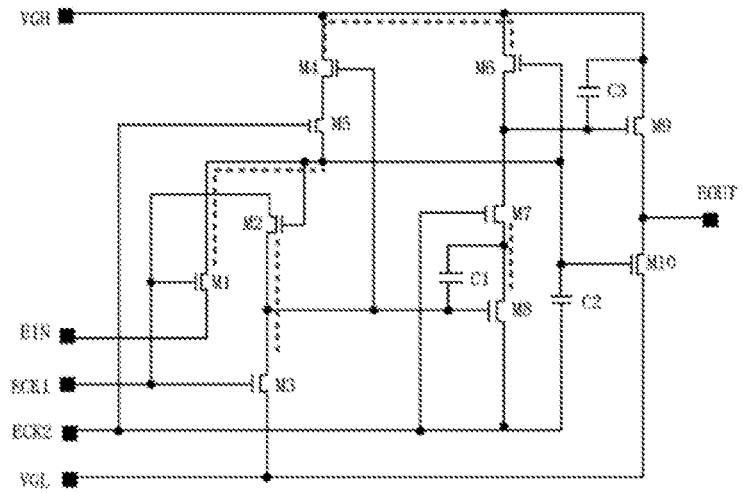
FIG. 10 is an illustration diagram of electrode sharing situations of transistors in FIG. 1.

In some embodiments of the present disclosure, as shown in the positions of the dotted lines in FIG. 10, it may set that, the first pole of the first transistor M1 is shared with the second pole of the fifth transistor M5, the second pole of the second transistor M2 is shared with the first pole of the third transistor M3, the first pole of the fourth transistor M4 is shared with the first pole of the sixth transistor M6, and the second pole of the seventh transistor M7 is shared with the first pole of the eighth transistor M8. In this way, the design space of the EOA circuit in the peripheral area may be saved to a large extent, which is conducive to the preparation of narrow frame display products.

In some embodiments of the present disclosure, the ninth transistor M9 includes a plurality of sub-transistors in parallel, and the tenth transistor M10 includes a plurality of sub-transistors in parallel. In this way, the width of the channel region of the ninth transistor M9 and the tenth transistor M10 may be increased, thus the source and drain current of the transistor may be increased, the impact of parasitic capacitance and parasitic resistance on the circuit may be reduced, and the driving ability of the EOA circuit may be improved.

In some embodiments of the present disclosure, referring to FIG. 16, the first capacitor C1, the second capacitor C2 and the third capacitor C3 are disposed in a same layer; each capacitor is located at a side of each transistor away from the silicon substrate 100; wherein, an orthographic projection of the first capacitor C1 on the silicon substrate 100 overlaps an orthographic projection of the tenth transistor M10 on the silicon substrate 100; an orthographic projection of the second capacitor C2 on the silicon substrate 100 partially overlaps the orthographic projection of the tenth transistor M10 on the silicon substrate 100, the orthographic projection of the second capacitor C2 on the silicon substrate 100 partially overlaps an orthographic projection of the ninth transistor M9 on the silicon substrate 100; and an orthographic projection of the third capacitor C3 on the silicon substrate 100 partially overlaps the orthographic projection of the ninth transistor M9 on the silicon substrate 100.

It should be noted that, the first capacitor C1, the second capacitor C2 and the third capacitor C3 are respectively disposed on the side of the transistor away from the silicon substrate 100, which may greatly save the design space of EOA circuit in the peripheral area and facilitate the preparation of narrow border display products.

In some embodiments, referring to FIG. 16, all transistors are located in the area between the signal lines and the display area. In order to reduce the overlapping area between the signal lines and the transistors, and avoid generating more parasitic capacitance, the larger tenth transistor M10 and ninth transistor M9 are disposed in the area close to the display area, and the smaller first transistor M1, second transistor M2, third transistor M3, fourth transistor M4, fifth transistor M5, six transistor M6, seven transistor M7, eight transistor M8, forward scan transistor Z and reverse sweep transistor F are disposed in the area close to each signal line.

Figure 17:
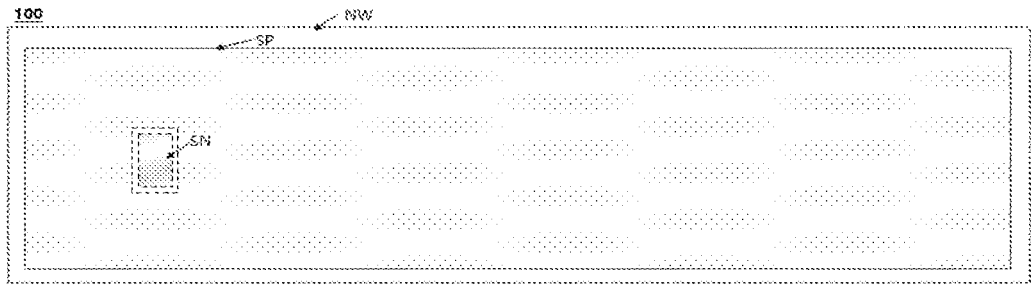
FIG. 17 is a schematic structural diagram of different areas on a silicon substrate of an array base plate.

In an exemplary embodiment, as shown in FIG. 17, before preparing the EOA circuit, N-type ion implantation is performed on the silicon substrate 100 to form the N-well area (NW), and then P-type ion implantation is performed in the N-well area NW to form the SP region, to form the channel region of the transistor. A small part of the SP area is the N-type ion implantation area SN. The specific treatment process of the silicon substrate 100 is not limited here, and the ion implantation types of different areas on the silicon substrate 100 are illustrated by taking the preparation of a P-type metal oxide semiconductor (PMOS) transistor as an example.

Figure 18:
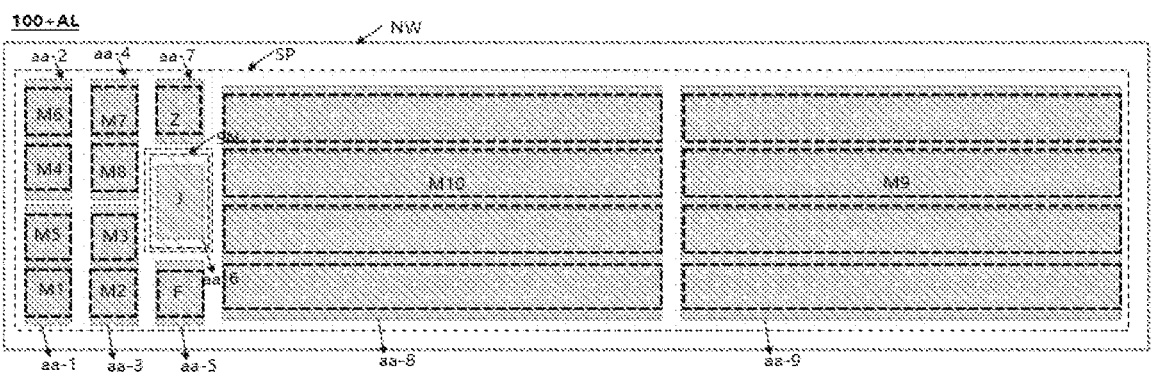
FIG. 18 is a schematic diagram of a tandem structure of a silicon substrate and a semiconductor layer.

In some embodiments of the present disclosure, as shown in FIG. 18, the array base plate includes a semiconductor layer AL located on the silicon substrate 100, the semiconductor layer includes an active region, a source region, and a drain region of each transistor of the EOA unit and a first sublayer of the power interface;

the semiconductor layer AL includes a first portion aa-1, a second portion aa-2, a third portion aa-3, a fourth portion aa-4, a fifth portion aa-5, a sixth portion aa-6, a seventh portion aa-7, an eighth portion aa-8 and a ninth portion aa-9 that are disposed at intervals with each other;

a connecting line of geometric centers of the first portion aa-1 and the second portion aa-2, a connecting line of geometric centers of the third portion aa-3 and the fourth portion aa-4, and a connecting line of geometric centers of the fifth portion aa-5, the sixth portion aa-6 and the seventh portion aa-7 are parallel; the fifth portion aa-5 is located at a side of the third portion aa-3 away from the first portion aa-1, the seventh portion aa-7 is located at a side of the fourth portion aa-4 away from the second portion aa-2, the sixth portion aa-6 is located between the fifth portion aa-5 and the seventh portion aa-7; and the ninth portion aa-9 is located at a side of the eighth portion aa-8 away from the sixth portion aa-6;

the first portion aa-1 includes the active regions, the source regions and the drain regions of the first transistor M1 and the fifth transistor M5, the second portion aa-2 includes the active regions, the source regions and the drain regions of the fourth transistor M4 and the sixth transistor M6, the third portion aa-3 includes the active regions, the source regions and the drain regions of the second transistor M2 and the third transistor M3, the fourth portion aa-4 includes the active regions, the source regions and the drain regions of the seventh transistor M7 and the eighth transistor M8; and the fifth portion aa-5 includes the active region, the source region and the drain region of the reverse sweep transistor F, the sixth portion aa-6 includes the first sublayer of the power interface J, the seventh portion aa-7 includes the active region, the source region and the drain region of the forward scan transistor Z; the eighth portion aa-8 includes the active region, the source region and the drain region of the tenth transistor M10, and the ninth portion aa-9 includes the active region, the source region and the drain region of the ninth transistor M9.

The specific material of the semiconductor layer is not limited here. For example, the material of the semiconductor layer may be silicon material, such as polysilicon.

In the specification, the transistor refers to a component that includes at least three terminals; the gate electrode, the drain electrode and the source electrode. The transistor has a channel region (active region) between the drain electrode (the drain or the drain region) and the source electrode (the source or the source region), and the current can flow through the drain electrode, the channel region and the source electrode. Please note that in the specification, the channel region refers to the region where the current mainly flows.

In the specification, in order to distinguish the two poles of the transistor other than the control pole, it is directly described in the relevant description of the circuit that one pole is the first pole and the other pole is the second pole. The first pole may be the drain electrode, the second pole may be the source electrode, or the first pole may be the source electrode, and the second pole may be the drain electrode. The functions of "source electrode" and "drain electrode" are sometimes exchanged when using transistors with opposite polarity or when the current direction changes during circuit operation. Therefore, in the specification, "source electrode" and "drain electrode" may be exchanged.

In addition, in the relevant description of the layout design of the EOA unit, the transistor has two poles except the control pole, one of which is described as source region and the other as drain region; The source region can be understood as the source, and the drain region can be understood as the drain. In the case of using a transistor with opposite polarity or the change of current direction in circuit operation, the functions of "source region" and "drain region" are sometimes exchanged. Therefore, in the specification, "source region" and "drain region" may be exchanged.

As shown in FIG. 18, the area marked by the rectangular dotted line is the active region (also called channel region) of each transistor. The active region is located between the source (source region) and the drain (drain region) of the transistor, and the current can flow through the drain, the channel region and the source.

For example, the tenth transistor M10 and the ninth transistor M9 respectively include four sub-transistors arranged in parallel. As shown in FIG. 18, the tenth transistor M10 and the ninth transistor M9 have four active regions (or channel regions) arranged at intervals, respectively.

As shown in FIG. 18, the upper and lower sides of the active region of each transistor are the source (source region) and the drain (drain region), respectively.

In an exemplary embodiment, the source (source region) and the drain (drain region) of each transistor may be doped to improve its conductivity. The doped element may be boron element, and so on.

As shown in FIG. 18, the first pole of the first transistor M1 is shared with the second pole of the fifth transistor M5, the second pole of the second transistor M2 is shared with the first pole of the third transistor M3, the first pole of the fourth transistor M4 is shared with the first pole of the sixth transistor M6, and the second pole of the seventh transistor M7 is shared with the first pole of the eighth transistor M8. The first pole may be the drain (drain region), the second pole may be the source (source region), or the first pole may be the source (source region), and the second pole may be the drain (dram region).

In some embodiments of the present disclosure, as shown in FIG. 18, an area of an orthographic projection of the eighth portion aa-8 of the semiconductor layer AL on the silicon substrate 100 is equal to an area of an orthographic projection of the ninth portion aa-9 on the silicon substrate 100, and is greater than areas of orthographic projections of the other portions on the silicon substrate 100.

Figure 19:
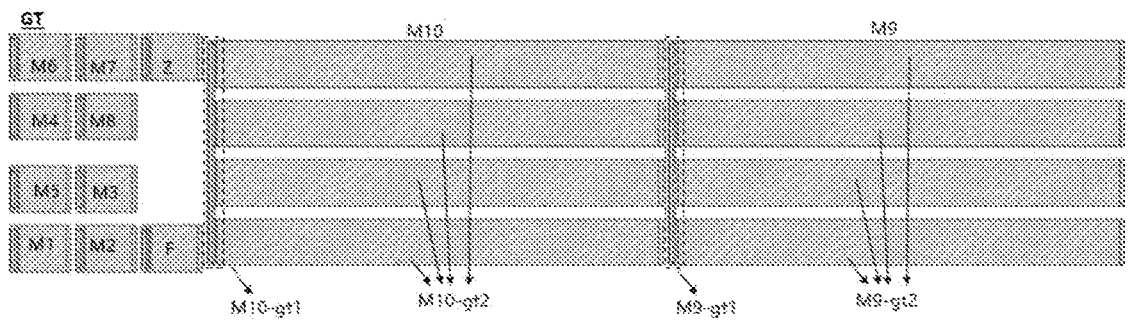
FIG. 19 is a schematic structural diagram of a gate layer of an array base plate.
Figure 20:
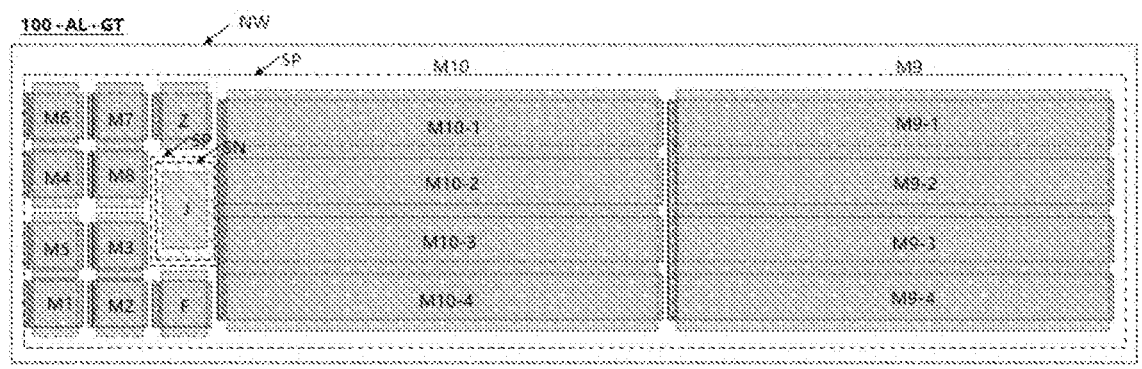
FIG. 20 is a schematic diagram of a tandem structure of a silicon substrate, a semiconductor layer and a gate layer of an array base plate.

In some embodiments of the present disclosure, as shown in FIG. 19, the array base plate further includes a gate layer GT located at a side of the semiconductor layer AL away from the silicon substrate 100;

combining FIG. 19 and FIG. 20, the gate layer GT includes the gate of each transistor, an orthographic projection of the gate layer GT on the silicon substrate 100 partially overlaps an orthographic projection of the semiconductor layer AL on the silicon substrate 100; a region of the semiconductor layer AL overlapping the orthographic projection of the gate layer GT on the silicon substrate 100 is the active region of each transistor, and a region of the semiconductor layer AL not overlapping the orthographic projection of the gate layer GT on the silicon substrate 100 is the source region or the drain region of each transistor;

as shown in FIG. 19, the gate of the ninth transistor M9 includes a first gate part M9-gt1 and four second gate parts M9-gt2, the second gate parts M9-gt2 are disposed at intervals and extend along a same direction, and the four second gate parts M9-gt2 are connected in parallel through the first gate part M9-gt1.

As shown in FIG. 19, the gate of the tenth transistor M10 includes a first gate part M10-gt1 and four second gate parts M10-gt2, the second gate parts M10-gt2 are disposed at intervals and extend along a same direction, and the four second gate parts M10-gt2 are connected in parallel through the first gate part M10-gt1.

The second gate parts M9-gt2 of the ninth transistor M9 are disposed at intervals, which refers to that there is a gap between the second gate parts M9-gt2, and the second gate parts M10-gt2 of the tenth transistor M10 being disposed at intervals has similar meaning.

In some embodiments of the present disclosure, as shown in FIG. 20, the tenth transistor M10 includes a first sub-transistor M10-1, a second sub-transistor M10-2, a third sub-transistor M10-3 and a fourth sub-transistor M10-4 that are disposed in parallel; each second gate part M10-gt2 is regarded as the gate of each sub-transistor; and the gates of four sub-transistors (four second gate parts M10-gt2) are connected in parallel through the first gate part M10-gt1.

As shown in FIG. 20, the ninth transistor M9 includes a fifth sub-transistor M9-1, a sixth sub-transistor M9-2, a seventh sub-transistor M9-3 and an eighth sub-transistor M9-4 that are disposed in parallel, each second gate part M9-gt2 is regarded as the gate of each sub-transistor; and the gates of four sub-transistors (four second gate parts M9-gt2) are connected in parallel through the first gate part M9-gt1.

As shown in FIG. 18, the eighth portion aa-8 of the semiconductor layer AL includes the active regions, the source regions and the drain regions of the first sub-transistor M10-1, the second sub-transistor M10-2, the third sub-transistor M10-3 and the fourth sub-transistor M10-4. Among them, the regions marked by four rectangular dotted lines in the eighth part aa-8 are four active regions, the upper and lower sides of the active regions are the source regions and the drain regions, respectively.

As shown in FIG. 18, the ninth portion aa-9 of the semiconductor layer AL includes the active regions, the source regions and the drain regions of the fifth sub-transistor M9-1, the sixth sub-transistor M9-2, the seventh sub-transistor M9-3 and the eighth sub-transistor M9-4. Among them, the regions marked by four rectangular dotted lines in the ninth portion aa-9 are four active regions, the upper and lower sides of the active regions are the source regions and the drain regions, respectively.

The source regions of the sub-transistors of the ninth transistor M9 are connected in parallel, the drain regions of the sub-transistors of the ninth transistor M9 are connected in parallel; the source regions of the sub-transistors of the tenth transistor M10 are connected in parallel, the drain regions of the sub-transistors of the tenth transistor M10 are connected in parallel.

In some embodiments of the present disclosure, an area of an orthographic projection of the second gate part (M9-gt2 or M10-gt2) on the silicon substrate is greater than an area of an orthographic projection of any one of the gates of the transistors except the gate of the ninth transistor M9 and the gate of the tenth transistor M10 on the silicon substrate 100.

In some embodiments of the present disclosure, combining FIG. 18 and FIG. 20, the drain region of the first sub-transistor M10-1 is shared with the drain region of the second sub-transistor M10-2, the source region of the second sub-transistor M10-2 is shared with the source region of the third sub-transistor M10-3, and the drain region of the third sub-transistor M 10-3 is shared with the drain region of the fourth sub-transistor M10-4; the drain region of the fifth sub-transistor M9-1 is shared with the drain region of the sixth sub-transistor M9-2, the source region of the sixth sub-transistor M9-2 is shared with the source region of the seventh sub-transistor M9-3, and the drain region of the seventh sub-transistor M9-3 is shared with the drain region of the eighth sub-transistor M9-4.

In the transistor, since the functions of the source region and the drain region may sometimes be exchanged, in some other embodiments of the present disclosure, as shown in FIG. 18 and FIG. 20, the source regions of the first sub-transistor M10-1 and the second sub-transistor M10-2 are shared, the drain regions of the second sub-transistor M10-2 and the third sub-transistor M10-3 are shared, the source regions of the third sub-transistor M10-3 and the fourth sub-transistor M10-4 are shared; the source regions of the fifth sub-transistor M9-1 and the sixth sub-transistor M9-2 are shared, the drain regions of the sixth sub-transistor M9-2 and the seventh sub-transistor M9-3 are shared, and the source regions of the seventh sub-transistor M9-3 and the eighth sub-transistor M9-4 are shared.

In this way, by sharing the source regions or the drain regions of the sub-transistors in the ninth transistor M9 and the tenth transistor M10, the driving capacity of the ninth transistor M9 and the tenth transistor M10 may be improved at the same time, and the design space occupied by the ninth transistor M9 and the tenth transistor M10 may be largely saved, which is conducive to reducing the size of the peripheral area and is suitable for the preparation of narrow border display products.

Figure 21:
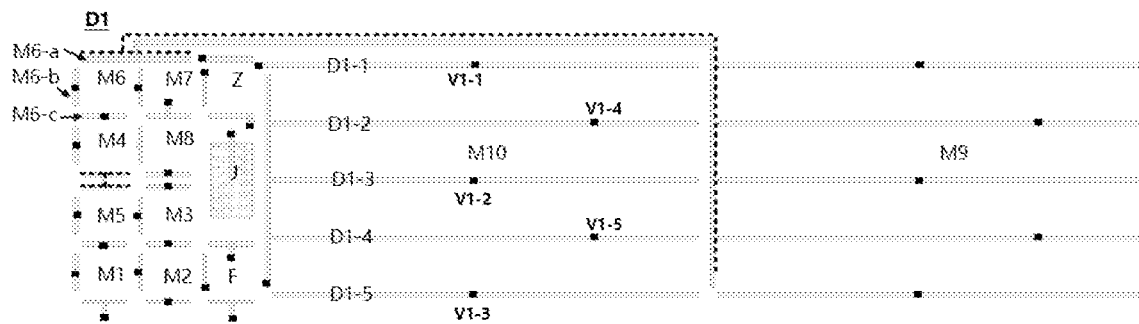
FIG. 21 is a schematic structural diagram of a first conductive layer of an array base plate.

In some embodiments of the present disclosure, as shown in FIG. 21, the array base plate further includes a first conductive layer D1 located at a side of the gate layer GT away from the silicon substrate 100;

the first conductive layer D1 includes a first connecting part of which an orthographic projection on the silicon substrate 100 overlapping the source region of each transistor (such as the first connecting part M6-*a* of the sixth transistor), a second connecting part of which an orthographic projection on the silicon substrate 100 overlapping the drain region of each transistor (such as the second connecting part M6-*c* of the sixth transistor), and a third connecting part of which an orthographic projection on the silicon substrate 100 overlapping the gate of each transistor (such as the third connecting part M6-*b* of the sixth transistor); the first connecting part of each transistor is electrically connected to the source region, the second connecting part of each transistor is electrically connected to the drain region, and the third connecting part of each transistor is electrically connected to the gate.

For example, as shown in FIG. 21, the first connecting part electrically connected to the source region of each transistor is disposed along a horizontal direction (for example, the first connecting pat M6-*a* of the sixth transistor), and the second connecting part electrically connected to the drain region of each transistor is disposed along the horizontal direction (for example, the second connecting part M6-*c* of the sixth transistor), and the third connecting part electrically connected to the gate of each transistor is disposed along a vertical direction (for example, the third connecting part M6-*b* of the sixth transistor).

In the exemplary embodiment, an insulation layer or dielectric layer is arranged between the first conductive layer D1 and the gate layer GT. The gate layer GT covers the active region in the semiconductor layer AL and exposes the source region and the drain region in the semiconductor layer AL. There are multiple via holes on the insulation layer or dielectric layer.

Figure 36:
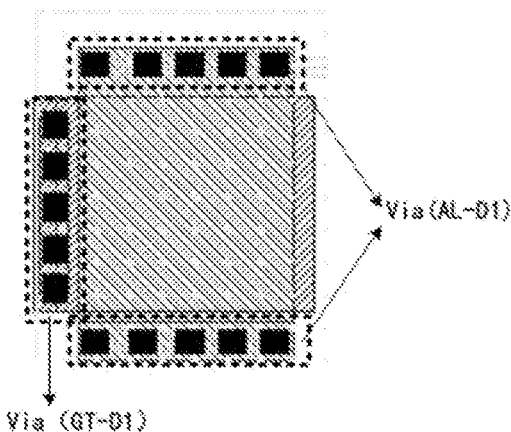
FIG. 36 is a position schematic diagram of via holes between a gate layer and a first conductive layer, and via holes between a semiconductor layer and the first conductive layer of a transistor according to an embodiment of the present disclosure.
Figure 37:
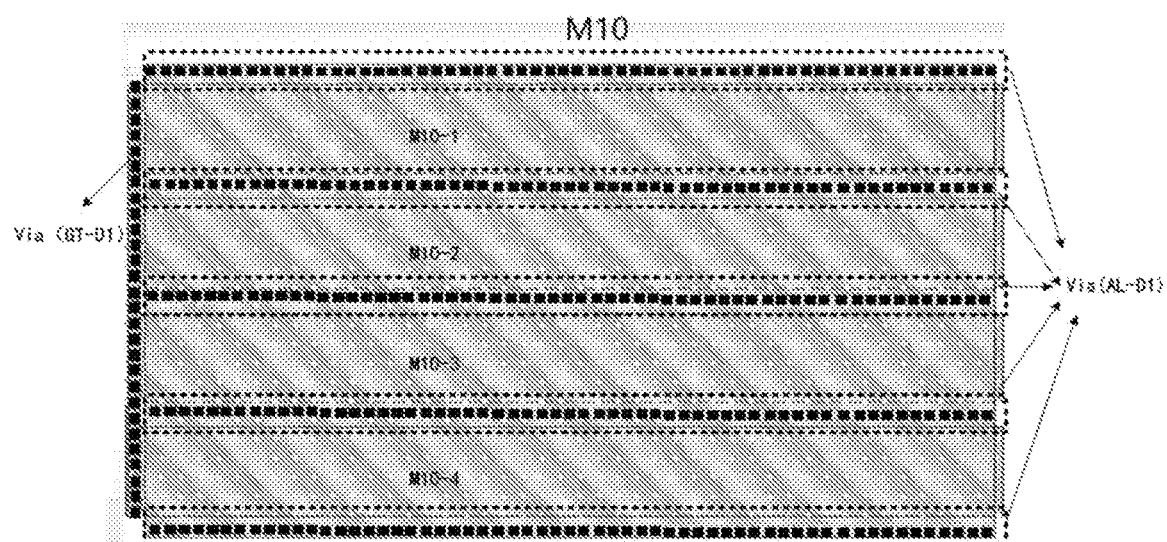
FIG. 37 is a position schematic diagram of via holes between a gate layer and a first conductive layer, and via holes between a semiconductor layer and the first conductive layer of another transistor according to an embodiment of the present disclosure.

As shown in FIG. 36 and FIG. 37, the first connecting part of each transistor in the first conductive layer D1 is electrically connected to the source region of each transistor in the semiconductor layer AL through a plurality of via holes filled with conductive materials (via holes Via (AL-D1) between the semiconductor layer AL and the first conductive layer D1). The second connecting part of each transistor in the first conductive layer D1 is electrically connected to the drain region of each transistor in the semiconductor layer AL through a plurality of via holes filled with conductive materials (via holes Via (AL-D1) between the semiconductor layer AL and the first conductive layer D1). The third connecting part of each transistor in the first conductive layer D1 is electrically connected to the gate of each transistor in the gate layer GT through a plurality of via holes filled with conductive materials (via holes Via (GT-D1) between the gate layer GT and the first conductive layer D1).

For example, taking the position where the third connecting part is located as an example, the area of the insulation layer between at least one third connecting part and the gate of the transistor is provided with multiple via holes, such as four via holes or five via holes, to improve its conduction stability and reduce contact resistance. To save space, multiple via holes may be arranged along the same direction.

It should be noted that in FIG. 21, the plurality of via holes in the insulation layer between the first conductive layer D1 and the gate layer GT are not drawn, and the plurality of via holes between the first conductive layer D1 and the semiconductor layer AL are not drawn.

As shown in FIG. 21, the area marked with a black rectangle is the position of the via holes on the insulation layer/dielectric layer between the second conductive layer D2 and the first conductive layer D1, which is used to electrically connect the structure in the first conductive layer D1 and the structure in the same position in the second conductive layer D2. Among them, each via hole is filled with conductive materials, such as tungsten metal (i.e., tungsten via hole, W-via).

In some embodiments, as shown in FIG. 18, FIG. 20 and FIG. 21, the second connecting part of the first transistor M1 and the first connecting part of the fifth transistor M5 are shared, the first connecting part of the second transistor M2 and the second connecting part of the third transistor M3 are shared, and the second connecting part of the fourth transistor M4 and the second connecting part of the sixth transistor M6 are shared, and the first connecting part of the seventh transistor M7 and the second connecting part of the eighth transistor M8 are shared.

In the transistor, since the functions of the source region and the drain region may sometimes be exchanged, the function of the first connecting part that overlaps with the source region of each transistor and that of the second connecting part that overlaps with the drain region of each transistor may also be exchanged. In some other embodiments, as shown in FIG. 18, FIG. 20 and FIG. 21, the first connecting part of the first transistor M1 is shared with the second connecting part of the fifth transistor M5, the second connecting part of the second transistor M2 is shared with the first connecting part of the third transistor M3, the first connecting part of the fourth transistor M4 is shared with the first connecting part of the sixth transistor M6, the second connecting part of the seventh transistor M7 is shared with the first connecting part of the eighth transistor M8.

Figure 22:
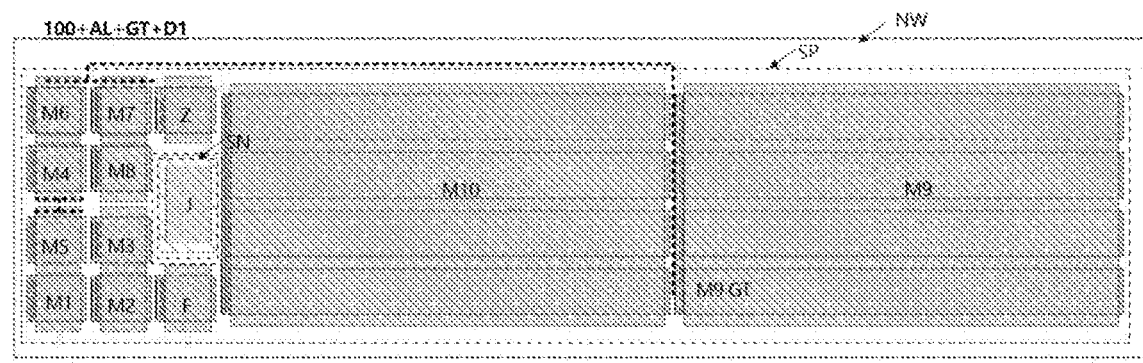
FIG. 22 is a schematic diagram of a tandem structure of a silicon substrate, a semiconductor layer, a gate layer and a first conductive layer of an array base plate.

As shown in FIG. 21 and FIG. 22, the first connecting part M6-2 of the sixth transistor M6 and the first connecting part of the seventh transistor M7 are an integrated structure, and is connected to the third connecting part of the ninth transistor M9; the second connecting part of the fourth transistor M4 is electrically connected to the first connecting part of the fifth transistor M5.

As shown in FIG. 18, FIG. 21 and FIG. 22, the first conductive layer D1 further includes a second sublayer of the power interface J, an orthographic projection of the first sublayer of the power interface J on the silicon substrate 100 is within an orthographic projection of the second sublayer of the power interface J on the silicon substrate 100, and the first sublayer and the second sublayer are electrically connected.

Figure 38:
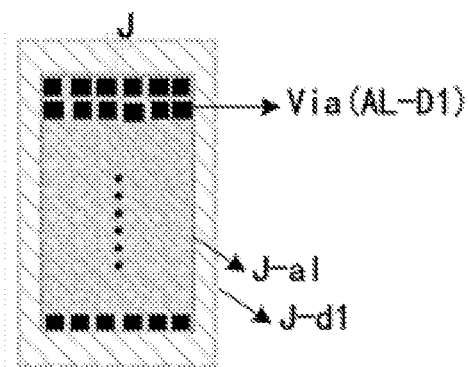
FIG. 38 is a position schematic diagram of via holes of a power interface between a semiconductor layer and a first conductive layer according to an embodiment of the present disclosure.

Among them, an insulation layer or a dielectric layer is set between the first conductive layer D1 and the gate layer GT, and the gate layer GT exposes the area where the first sub-layer of the power interface J is located, as shown in FIG. 38, the first sub-layer J-a1 and the second sub-layer J-d1 of the power interface J are electrically connected through a plurality of via holes arranged in array in the insulation layer or the dielectric layer. And each via hole is filled with conductive materials, such as tungsten metal (i.e., tungsten via hole, W-via).

In addition, the orthographic projection of the first sublayer of the power interface J on the silicon substrate 100 is within the orthographic projection of the second sublayer of the power interface J on the silicon substrate 100, which includes at least two cases: as shown in FIG. 38, the outer contour of the orthographic projection of the first sublayer J-a1 of the power interface J on the silicon substrate 100 is within the outer contour of the orthographic projection of the second sublayer J-d1 of the power interface J on the silicon substrate 100; or, the outer contour of the orthographic projection of the first sublayer J-a1 of the power interface J on the silicon substrate 100 overlaps with the outer contour of the orthographic projection of the second sublayer J-d1 of the power interface J on the silicon substrate 100.

As shown in FIG. 18, FIG. 20 and FIG. 21, in the tenth transistor M10, the second connecting part of the first sub-transistor M10-1 is shared with the second connecting part of the second sub-transistor M10-2, the first connecting part of the second sub-transistor M10-2 is shared with the first connecting part of the third sub-transistor M10-3, and the second connecting part of the third sub-transistor M10-3 is shared with the second connecting part of the fourth sub-transistor M10-4.

Alternatively, in the tenth transistor M10, the first connecting part of the first sub-transistor M10-1 is shared with the first connecting part of the second sub-transistor M10-2, the second connecting part of the second sub-transistor M10-2 is shared with the second connecting part of the third sub-transistor M10-3, and the first connecting part of the third sub-transistor M10-3 is shared with the first connecting part of the fourth sub-transistor M10-4.

As shown in FIG. 18, FIG. 20 and FIG. 21, in the ninth transistor M9, the second connecting part of the fifth sub-transistor M9-1 is shared with the second connecting part of the sixth sub-transistor M9-2, the first connecting part of the sixth sub-transistor M9-2 is shared with the first connecting part of the seventh sub-transistor M9-3, the second connecting part of the seventh sub-transistor M9-3 is shared with the second connecting part of the eighth sub-transistor M9-4.

Alternatively, in the ninth transistor M9, the first connecting part of the fifth sub-transistor M9-1 is shared with the first connecting part of the sixth sub-transistor M9-2, the second connecting part of the sixth sub-transistor M9-2 is shared with the second connecting part of the seventh sub-transistor M9-, and the first connecting part of the seventh sub-transistor M9-3 is shared with the first connecting part of the eighth sub-transistor M9-4.

Figure 23:
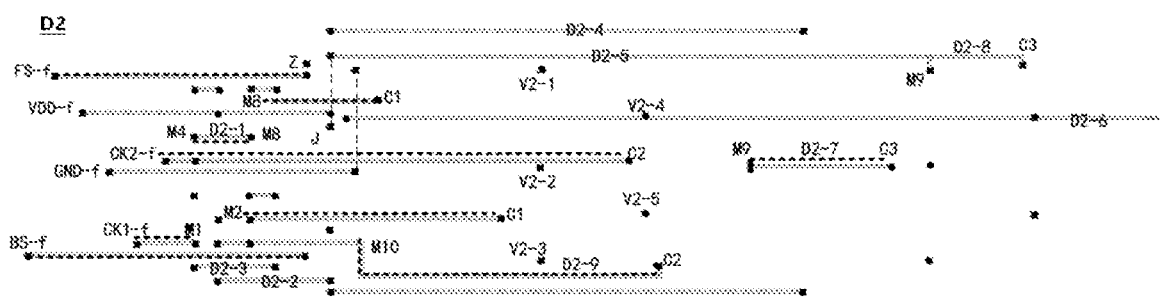
FIG. 23 is a schematic structural diagram of a second conductive layer of an array base plate.
Figure 27:
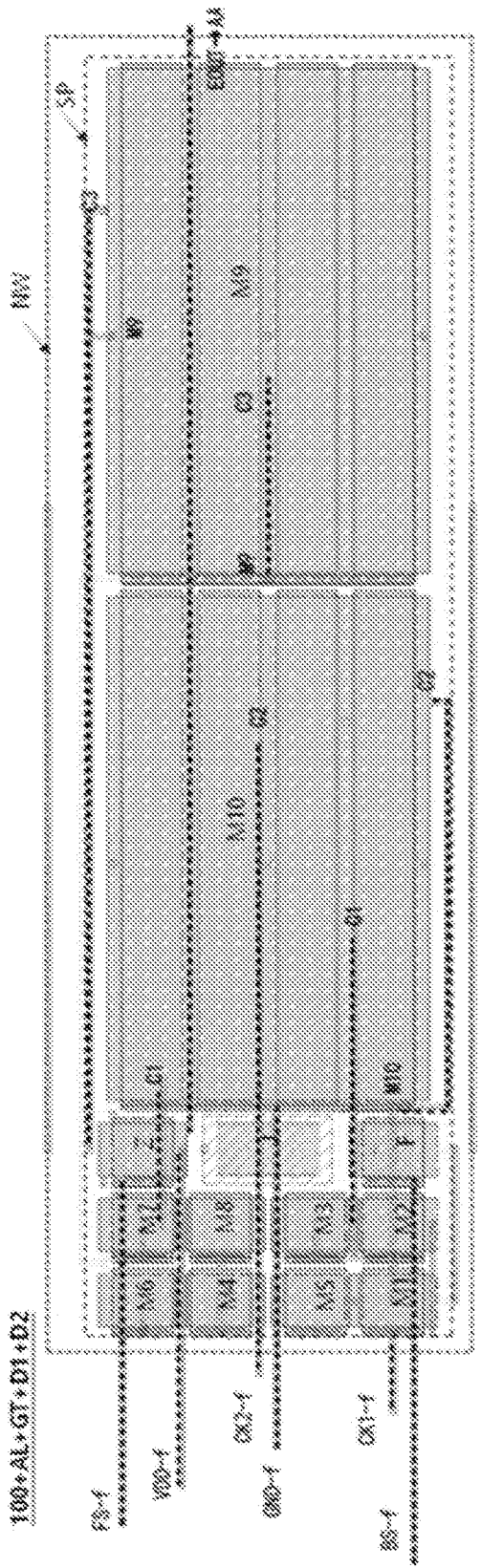
FIG. 27 is a schematic diagram of a tandem structure of a silicon substrate, a semiconductor layer, a gate layer, a first conductive layer and a second conductive layer of an array base plate.

As shown in FIG. 23, the array base plate further includes a second conductive layer D2 located at a side of the first conductive layer D1 away from the silicon substrate 100;

the second conductive layer D2 includes a forward scan auxiliary line FS-s, a reverse sweep auxiliary line BS-f, a first power auxiliary line VDD-f, a second power auxiliary line GND-f (take the connection of the second power auxiliary line to the ground wire as an example), a first clock auxiliary line CK1-$f$ and a second clock auxiliary line CK2-$f$ with a same extension direction;

as shown in FIG. 16, FIG. 23, and FIG. 27, the forward scan auxiliary line FS-s is electrically connected to the gate of the forward scan transistor Z and the forward scan control signal line FS, the reverse sweep auxiliary line BS-f is electrically connected to the gate of the reverse sweep transistor F and the reverse sweep control signal line BS; and the first power auxiliary line VDD-f is electrically connected to the source region of the ninth transistor M9 and the second sublayer of the power interface J, the second power auxiliary line GND-f is electrically connected to the source region of the tenth transistor M10, the first clock auxiliary line CK1-$f$ is electrically connected to the gate of the first transistor M1, and the second clock auxiliary line CK2-$f$ is electrically connected to the second capacitor C2.

In the exemplary embodiment, as shown in FIG. 23, the first power auxiliary line VDD-f is electrically connected to the source region of the ninth transistor M9 through the connecting line D2-5, and the first power auxiliary line VDD-f is electrically connected to the second sub-layer of the power interface J through the vertical downward connecting line in the third conductive layer D3 (as shown in the dotted line segment intersecting with the first power auxiliary line VDD-f in FIG. 23).

Figure 24:
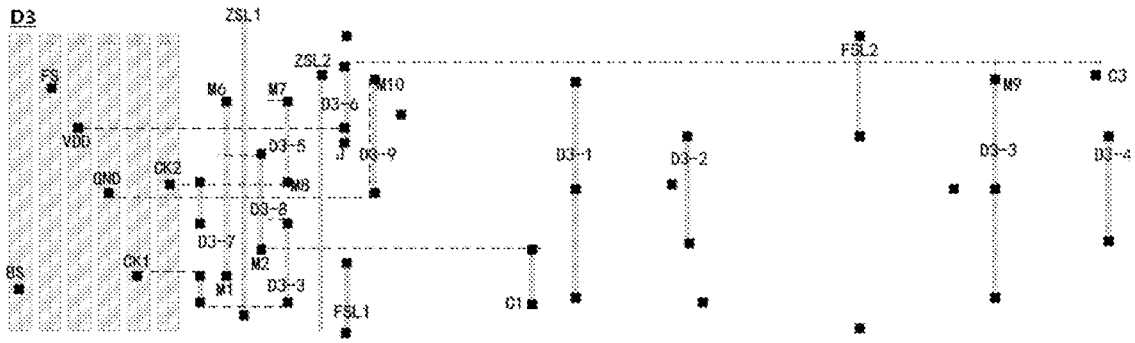
FIG. 24 is a schematic structural diagram of a third conductive layer of an array base plate.

In the exemplary embodiment, combined with FIG. 23 and FIG. 24, the second power auxiliary line GND-f is electrically connected to the source region of the tenth transistor M10 through the connecting line D3-6 in the third conductive layer D3.

In the exemplary embodiment, as shown in FIG. 23, the connecting line D2-1 extends from the top of the four transistor M4 to the top of the eight transistor M8, and electrically connects the gate of the four transistor M4 and the gate of the eight transistor M8.

In the exemplary embodiment, as shown in FIG. 23, the connecting line D2-3 in the second conductive layer D2 electrically connects the first pole of the second transistor M2 and the second pole of the first transistor M1, and then is electrically connected to the second pole of the reverse sweep transistor F through the connecting line D2-2.

In the exemplary embodiment, as shown in FIG. 23, the connecting line D2-7 in the second conductive layer D2 electrically connects the gate of the ninth transistor M9 and the second electrode of the third capacitor C3, and the connecting line D2-8 in the second conductive layer D2 electrically connects the first electrode of the third capacitor C3 and the first pole of the ninth transistor M9.

In the exemplary embodiment, as shown in FIG. 23, the connecting line D2-9 in the second conductive layer D2 electrically connects the first electrode of the second capacitor C2 and the gate of the tenth transistor M10.

In some embodiments of the present disclosure, as shown in FIG. 23 and FIG. 35, the second conductive layer D2 further includes the reverse sweep signal output line D2-4 (EOUT2→EOA n−1) and the light-emitting control signal output line D2-6(EOUT1→AA);

the reverse sweep signal output line D24 (EOUT2→EOA n−1) of the EOA unit at the n-th level is electrically connected to the reverse sweep transistor F of the EOA unit at a (n−1)-th level, the light-emitting control signal output line (EOUT1→AA) of the EOA unit at the n-th level is electrically connected to the pixel driving units of at least one row of the sub-pixels; and an orthographic projection of the reverse sweep signal output line D2-4 (EOUT2→EOA n−1) on the silicon substrate 100 and the orthographic projection of each transistor on the silicon substrate 100 do not overlap with each other, an orthographic projection of the light-emitting control signal output line (EOUT1→AA) on the silicon substrate 100 overlaps orthographic projections of the tenth transistor M10 and the ninth transistor M9 on the silicon substrate 100.

It should be noted that in the embodiment of the present disclosure, "overlapping" refers to at least partial overlapping, which will not be repeated elsewhere.

In an exemplary embodiment, the light-emitting control signal output line (EOUT1→AA) in the EOA unit at the n-th level is electrically connected to each pixel driving unit in a row of sub-pixels. Alternatively, the light-emitting control signal output line (EOUT1→AA) in the EOA unit at the n-th level is electrically connected to each pixel driving unit in the two sub-pixels.

In addition, it should be noted that in FIG. 23, the area marked with a black rectangle is the position of the via holes on the insulation layer between the second conductive layer D2 and the third conductive layer D3, which is used to electrically connect the structure in the third conductive layer D3 and the structure in the same position in the second conductive layer D2. The via holes are filled with conductive materials, such as tungsten (W).

As shown in FIG. 21 and FIG. 23, taking the via hole in the area where the tenth transistor M10 is located as an example, the area delineated by the orthographic projection of the outer contour of the via hole V1-1 on the silicon substrate 100 overlaps with the area delineated by the orthographic projection of the outer contour of the via hole V2-1 on the silicon substrate 100. The area delineated by the orthographic projection of the outer contour of the via hole V1-2 on the silicon substrate 100 overlaps with the area delineated by the orthographic projection of the outer contour of the via hole V2-2 on the silicon substrate 100. The area delineated by the orthographic projection of the outer contour of the via hole V1-3 on the silicon substrate 100 overlaps with the area delineated by the orthographic projection of the outer contour of the via hole V2-3 on the silicon substrate 100. The area delineated by the orthographic projection of the outer contour of the via hole V1-4 on the silicon substrate 100 overlaps with the area delineated by the orthographic projection of the outer contour of the via hole V2-4 on the silicon substrate 100. The area delineated by the orthographic projection of the outer contour of the via hole V1-5 on the silicon substrate 100 overlaps with the area delineated by the orthographic projection of the outer contour of the via hole V2-5 on the silicon substrate 100.

Figure 28:
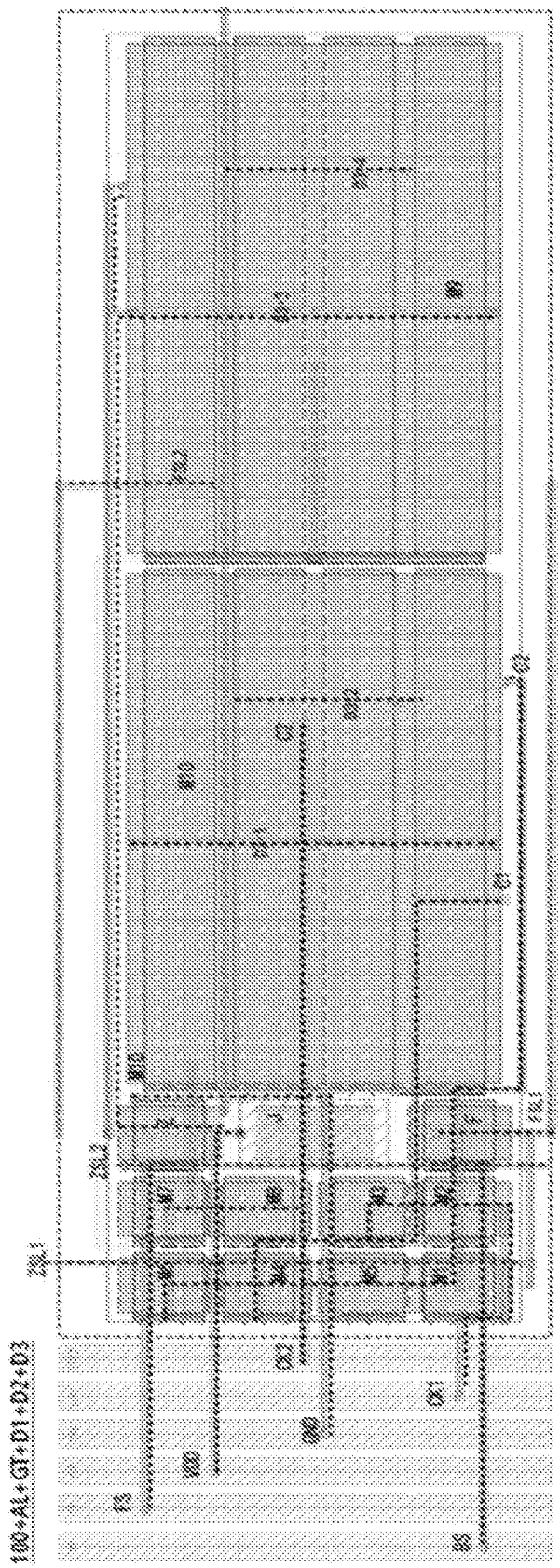
FIG. 28 is a schematic diagram of a tandem structure of a silicon substrate, a semiconductor layer, a gate layer, a first conductive layer, a second conductive layer and a third conductive layer of an array base plate.

In some embodiments of the present disclosure, as shown in FIG. 24, the array base plate further includes a third conductive layer D3 located at a side of the second conductive layer D2 away from the silicon substrate 100;

the third conductive layer D3 includes the forward scan control signal line FS, the reverse sweep control signal line BS, the first power signal line VDD, the second power signal line (for example, the second power signal line is the ground wire GND), the first clock signal line CK1, and the second clock signal line CK2 with a same extension direction and arranged along a first direction; the first direction is a direction that the peripheral area points to the display area (for example, the direction from left to right in the horizontal direction in FIG. 24), as shown in FIG. 23 and FIG. 24, and the extension direction of the forward scan control signal line FS intersects the extension direction of the forward scan auxiliary line FS-f (e.g., vertical); and as shown in FIG. 27 and FIG. 28, the first power signal line VDD is electrically connected to the first power auxiliary line VDD-f, the second power signal line (for example, the ground wire GND) is electrically connected to the second power auxiliary line GND-f, the first clock signal line CK1 is electrically connected to the first clock auxiliary line CK1-f, and the second clock signal line CK2 is electrically connected to the second clock auxiliary line CK2-f.

As shown in FIG. 24, the third conductive layer D3 further includes a first source region connecting line D3-1, a first drain region connecting line D3-2, a second source region connecting line D3-3 and a second drain region connecting line D3-4 extending along a second direction (such as extending along the vertical direction); the second direction intersects the first direction;

among them, the first source region connecting line D3-1 connects the source regions of the first sub-transistor M10-1, the second sub-transistor M10-2, the third sub-transistor M10-3 and the fourth sub-transistor M10-4 of the tenth transistor M10 in parallel, the first drain region connecting line D3-2 connects the drain regions of the first sub-transistor M10-1, the second sub-transistor M10-2, the third sub-transistor M10-3 and the fourth sub-transistor M10-4 in parallel;

the second source region connecting line D3-3 connects the source regions of the fifth sub-transistor M9-1, the sixth sub-transistor M9-2, the seventh sub-transistor M9-3 and the eighth sub-transistor M9-4 of the ninth transistor M9 in parallel; and the second drain region connecting line D3-4 connects the drain regions of the fifth sub-transistor M9-1, the sixth sub-transistor M9-2, the seventh sub-transistor M9-3 and the eighth sub-transistor M9-4 in parallel.

It should be noted that, as shown in FIG. 24, the area marked with a black rectangle is the position of the via holes on the insulation layer between the second conductive layer D2 and the third conductive layer D3, which is used to electrically connect the structure in the third conductive layer D3 and the structure in the same position in the second conductive layer D2. The via holes are filled with conductive materials, such as tungsten (W).

As shown in FIG. 24 and FIG. 34, the third conductive layer D3 further includes a first forward scan signal input line ZSL1 and a second forward scan signal input line ZSL2 extending along the first direction (e.g., vertical direction);

the first pole of the forward scan transistor Z of the EOA unit at the (n−1)-th level is electrically connected to the second pole of the first transistor M1 of the EOA unit at the n-th level through the second forward scan signal input line ZSL2; and the first pole of the forward scan transistor Z of the EOA unit at the n-th level is electrically connected to the second pole of the first transistor M1 of the EOA unit at the (n+1)-th level through the first forward scan signal input line ZSL1.

As shown in FIG. 24 and FIG. 35, the third conductive layer D3 further includes a reverse sweep signal input line FSL1 and a reverse sweep signal output line FSL2 extending along the first direction (e.g., vertical direction), among them, the reverse sweep signal input line FSL1 of the EOA unit at the n-th level is used to transmit and receive the output signal of the EOA unit at the (n+1)-th level, the reverse sweep signal output line FSL2 of the EOA unit at the n-th level is used to transmit the signal of the EOA unit at the n-th level to the reverse sweep transistor F of the EOA unit at the (n−1)-th level.

As shown in FIG. 24 and FIG. 28, the connecting line D3-5 in the third conductive layer D3 electrically connects the gate of the seventh transistor M7 and the second pole of the eighth transistor M8.

As shown in FIG. 23 and FIG. 24, the connecting line D3-6 in the third conductive layer D3 is located above the forward scan transistor Z and extends to the position of the power interface J. The connecting line D3-6 in the third conductive layer D3 is electrically connected to the first power auxiliary line VDD-f and the connecting line D2-5 in the second conductive layer D2, respectively. Thus, the first electrode of the third capacitor C3 and the first pole of the ninth transistor 19 are electrically connected to the first power auxiliary line VDD-f, respectively.

As shown in FIG. 23. FIG. 24 and FIG. 28, the connecting line D3-7 in the third conductive layer D3 extends from the position of the sixth transistor M6 to the position of the first transistor M1, and is electrically connected to the connecting line D2-9 in the second conductive layer D2. The connecting line D3-7 in the third conductive layer D3 is electrically connected to the gate of the sixth transistor M6, the connecting line D2-9 in the second conductive layer D2 is electrically connected to the first electrode of the second capacitor C2, thus electrically connecting the gate of the sixth transistor M6 and the first electrode of the second capacitor C2.

As shown in FIG. 24 and FIG. 28, the connecting line D3-8 in the third conductive layer D3 electrically connects the gate of the eighth transistor M8 and the second pole of the second transistor M2. Since the second pole of the second transistor M2 is shared with the first pole of the third transistor M3, the connecting line D3-8 in the third conductive layer D3 also electrically connects the gate of the eighth transistor M8 and the first pole of the third transistor M3. Then, the gate of the eight transistor M8 is electrically connected to the second electrode of the first capacitor C1 through the connecting line marked M2-C1 in FIG. 23.

As shown in FIG. 24, the connecting line D3-9 in the third conductive layer D3 electrically connects the second pole of the tenth transistor to the second power auxiliary line GND-f in the second conductive layer D2.

Figure 25:
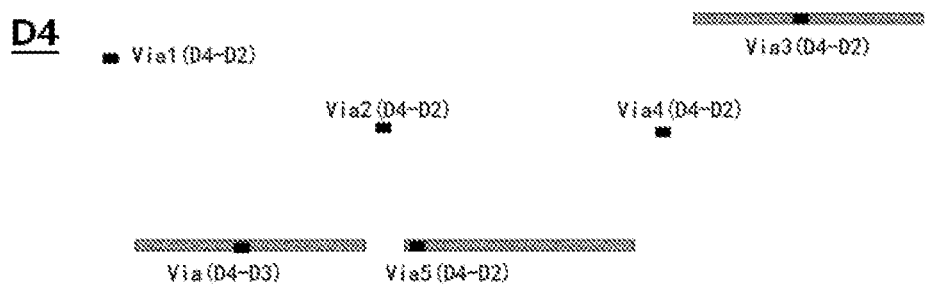
FIG. 25 is a schematic structural diagram of a fourth conductive layer of an array base plate.
Figure 26:
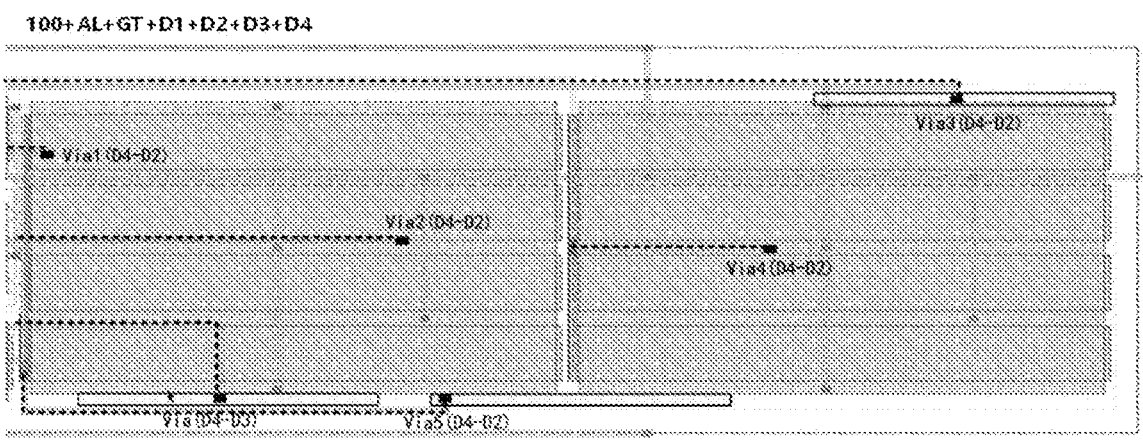
FIG. 26 is a schematic diagram of a tandem structure of a silicon substrate, a semiconductor layer, a gate layer, a first conductive layer, a second conductive layer, a third conductive layer and a fourth conductive layer of an array base plate.

In some embodiments of the present disclosure, as shown in FIG. 25 and FIG. 26, the array base plate further includes a fourth conductive layer D4 located at a side of the third conductive layer D3 away from the silicon substrate 100.

As shown in FIG. 25 and FIG. 26, the area marked with a black rectangle in the fourth conductive layer D4 is the via hole filled with conductive materials between the bottom conductive layer and the fourth conductive layer D4, which is used to electrically connect the bottom conductive structure (such as connecting line) and the fourth conductive layer D4 at the marked position, and which is electrically connected to the fifth conductive layer D5 (including the lower plate of each capacitor) through the structure in the fourth conductive layer D4.

As shown in FIG. 23 and FIG. 26, the via hole Via1(D4-D2) filled with conductive materials is electrically connected to the connecting line C1-M8 in the second conductive layer D2, which is used to electrically connect the first pole of the eighth transistor M8 and the upper plate (first electrode) of the first capacitor C1.

The via hole Via2(D4-D2) filled with conductive materials is electrically connected to the connecting line CK2-$f$-C2 in the second conductive layer D2, which is used to electrically connect the second clock auxiliary line CK2-$f$ to the upper plate (second electrode) of the second capacitor C2.

The via hole Via3(D4-D2) filled with conductive materials is electrically connected to the connecting lines D2-5 and D2-8 in the second conductive layer D2, which is used to electrically connect the first power signal auxiliary line VDD-f and the bottom plate (first electrode) of the third capacitor C3.

The via hole Via4(D4-D2) filled with conductive materials is electrically connected to the connecting line D2-7 in the second conductive layer D2, which is used to electrically connect the gate of the ninth transistor M9 and the upper plate (second electrode) of the third capacitor C3.

The via hole Via5(D4-D2) filled with conductive materials is electrically connected to the connecting line D2-9 in the second conductive layer D2, which is used to electrically connect the gate of the tenth transistor M10 and the bottom plate (first electrode) of the second capacitor C2.

The via hole Via(D4-D3) filled with conductive materials is electrically connected to the connecting line marked C1 in the third conductive layer D2, which is used to electrically connect the bottom plate (second electrode) of the first capacitor C1 and the second pole of the second transistor M2. Among them, the via hole Via(D3-D2) refers to the via hole in the insulation layer between the second conductive layer D2 and the third conductive layer D3.

Figure 29:
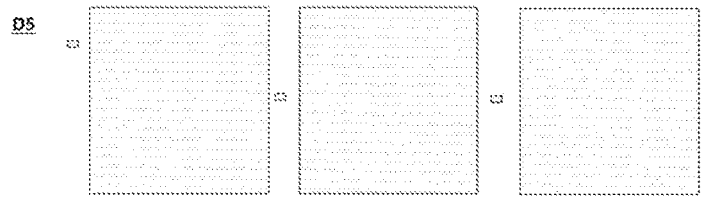
FIG. 29 is a schematic structural diagram of a fifth conductive layer of am array base plate.
Figure 30A:
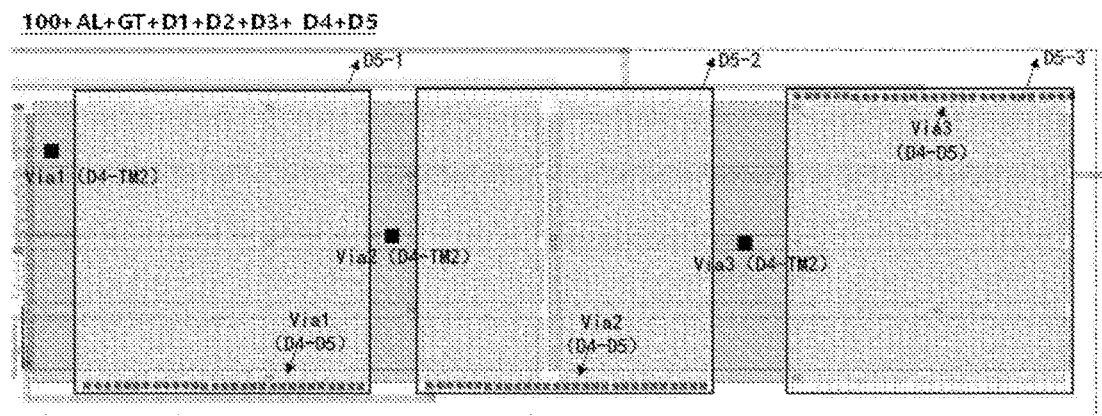
FIG. 30A and FIG. 30B are schematic diagrams of a tandem structure of a silicon substrate, a semiconductor layer, a gate layer, a first conductive layer, a second conductive layer, a third conductive layer, a fourth conductive layer and a fifth conductive layer of two array base plates.
Figure 30B:
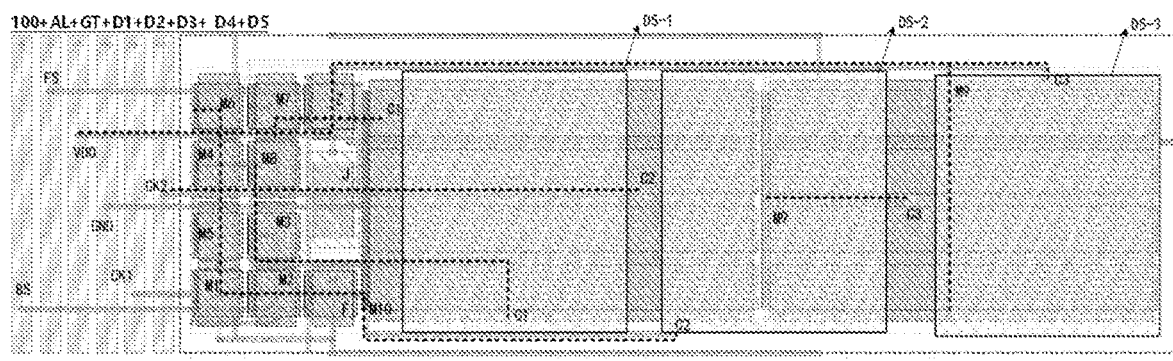

As shown in FIG. 29 and FIG. 30B, the array base plate further includes a fifth conductive layer D5 located at a side of the fourth conductive layer D4 away from the silicon substrate 100; the fifth conductive layer D5 includes the bottom plate of each capacitor, such as the second electrode D5-1 of the first capacitor C1, the first electrode D5-2 of the second capacitor C2 and the second electrode D5-3 of the third capacitor C3.

The specific plane shape of the bottom plate of each capacitor in the fifth conductive layer D5 is not limited here. For example, the plane shape of the bottom plate may include a polygon, an arc, or a shape formed by a combination of polygons and arcs.

Figure 31:
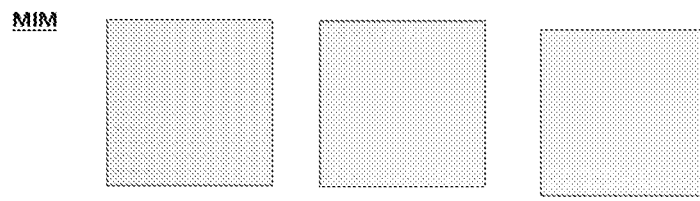
FIG. 31 is a schematic structural diagram of a sixth conductive layer of an array base plate.

As shown in FIG. 31, the array base plate further includes a sixth conductive layer MIM located at a side of the fifth conductive layer D5 away from the silicon substrate 100; the sixth conductive layer MIM includes the upper plate of each capacitor, such as the first electrode of the first capacitor C1, the second electrode of the second capacitor C2 and the first electrode of the third capacitor C3. The bottom plate of each capacitor in the fifth conductive layer D5 and the upper plate of each capacitor in the sixth conductive layer MIM constitute the metal-insulator-metal (MIM) capacitance structure. The upper plate of each capacitor is electrically connected to part area in the second connecting layer TM2 to electrically connect the upper plate of each capacitor and other components through the second connecting layer TM2.

The specific plane shape of the upper plate of each capacitor in the sixth conductive layer MIM is not limited here. For example, the plane shape of its upper plate may include polygons, arcs or the shape formed by the combination of polygons and arcs.

Figure 33:
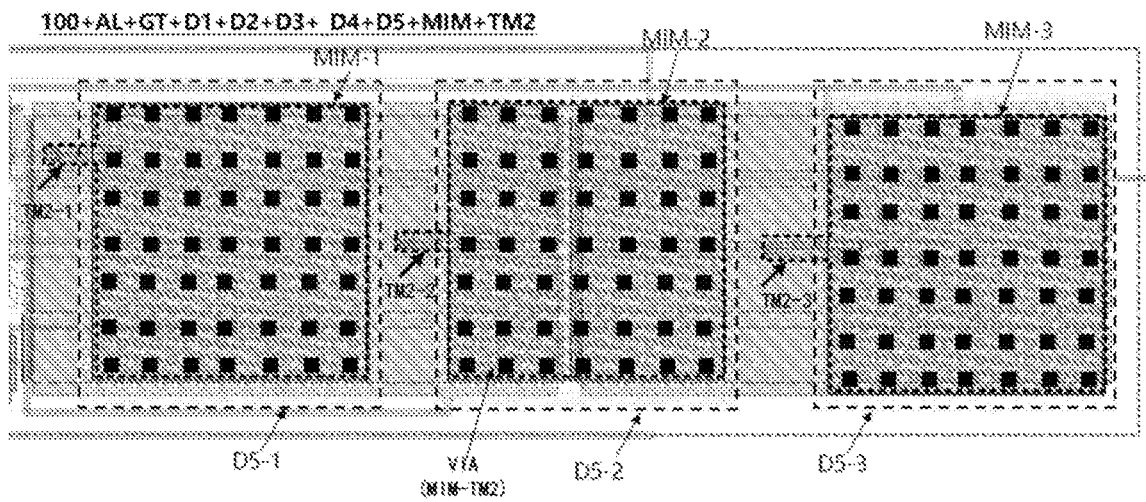
FIG. 33 is a schematic diagram of a tandem structure of a silicon substrate, a semiconductor layer, a gate layer, a first conductive layer, a second conductive layer, a third conductive layer, a fourth conductive layer, a fifth conductive layer, a sixth conductive layer and a second connecting layer of an array base plate.

It should be noted that in FIG. 16, the outer contour of the areas marked C1, C2 and C3 represents an effective overlapping area between the upper plates and the bottom plates of the first capacitor C1, the second capacitor C2 and the third capacitor C3. In FIG. 33, another effective overlapping area between the upper plates and the bottom plates of each capacitor is shown.

For the via hole marking mode provided in the embodiment of the present disclosure, for example, the via hole Via(D4-TM2) refers to the via holes in the insulation layer between the fourth conductive layer D4 and the second connecting layer TM2, for example, the via hole Via(D4-D2) refers to the via holes in the insulation layer between the second conductive layer D2 and the fourth conductive layer D4. The meaning of other similar via hole marks is similar to this, which is not repeated.

As shown in FIG. 29 and FIG. 30A, the via hole Via1 (D4-TM2) filled with conductive materials is electrically connected to the via hole Via1(D4-D2) as shown in FIG. 26, which is used to electrically connect the first pole of the eighth transistor M8 and the upper plate (first electrode) of the first capacitor C1.

As shown in FIG. 29 and FIG. 30A, the via hole Via2 (D4-TM12) filled with conductive materials is electrically connected to the via hole Via2(D4-D2) as shown in FIG. 26, which is used to electrically connect the second clock auxiliary line CK2-f and the upper plate (second electrode) of the second capacitor C2.

As shown in FIG. 29 and FIG. 30A, the via hole Via3 (D4-TM2) filled with conductive materials is electrically connected to the via hole Via4(D4-D2) as shown in FIG. 26, which is used to electrically connect the gate of the ninth transistor M9 and the upper plate (second electrode) of the third capacitor C3.

As shown in FIG. 29 and FIG. 30A, a row of via holes Via1(D4-D5) filled with conductive materials is connected to the corresponding positions of the fourth conductive layer D4 in FIG. 25, and the bottom plate (second electrode) of the first capacitor C1 is further electrically connected to the second pole of the second transistor M2 through the via hole Via(D4-D3) in FIG. 26.

As shown in FIG. 29 and FIG. 30A, a row of via holes Via2(D4-D5) filled with conductive materials is connected to the corresponding positions of the fourth conductive layer D4 in FIG. 25, and the gate of the tenth transistor M10 is further electrically connected to the bottom plate (first electrode) of the second capacitor C2 through the via hole Via5(D4-D2) in FIG. 26.

As shown in FIG. 29 and FIG. 30A, a row of via holes Via3(D4-D5) filled with conductive materials is connected to the corresponding positions of the fourth conductive layer D4 in FIG. 25, and the first power signal auxiliary line VDD-f is further electrically connected to the bottom plate (first electrode) of the third capacitor C3 through the via hole via3(D4-D2) in FIG. 26.

Figure 32:
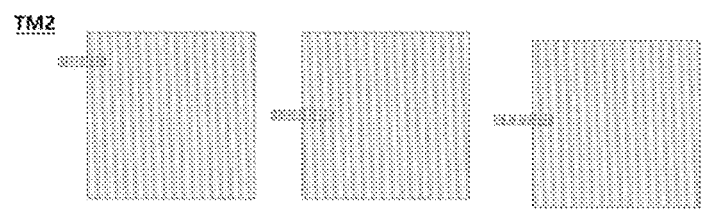
FIG. 32 is a schematic structural diagram of a second connecting layer of an array base plate.

As shown in FIG. 32 and FIG. 33, the array base plate also includes the second connecting layer TM2 located on a side of the sixth conductive layer MIM away from the silicon substrate 100. The second connecting layer TM2 includes the first portion TM2-1 electrically connected to the upper plate of the first capacitor C1, the second portion TM2-2 electrically connected to the upper plate of the second capacitor C2, and the third portion TM2-3 electrically connected to the upper plate of the third capacitor C3.

As shown in FIG. 30A and FIG. 33, the via hole Via1 (D4-TM2) filled with conductive materials is electrically connected to the upper plate (first electrode) of the first capacitor C1 through the first portion TM2-1 in the second connecting layer TM2.

As shown in FIG. 30A and FIG. 33, the via hole Via2 (D4-TM2) filled with conductive materials is electrically connected to the upper plate (second electrode) of the second capacitor C2 through the second portion TM2-2 in the second connecting layer TM2.

As shown in FIG. 30A and FIG. 33, the via hole Via3 (D4-TM2) filled with conductive materials is electrically connected to the upper plate (second electrode) of the third capacitor C3 through the third portion TM2-3 in the second connecting layer TM2.

In addition, in FIG. 33, the first portion TM2-1 in the second connecting layer TM2 is electrically connected to the first portion MIM-1 of the sixth conductive layer MIM through a plurality of via holes VIA(MIN-TM2) arranged in array, the second portion TM2-2 in the second connecting layer TM2 is electrically connected to the second portion MIM-2 of the sixth conductive layer MIM through a plurality of via holes VIA(MIN-TM2) arranged in array, and the third portion TM2-3 in the second connecting layer TM2 is electrically connected to the third portion MIM-3 of the sixth conductive layer MIM through the via holes VIA (MIN-TM2) arranged in array.

In some embodiments, the array base plate may also include the first connecting layer TM1 between the sixth conductive layer MIM and the second connecting layer TM2. The structure of the first connecting layer TM1 is not specifically limited here, but can be determined according to the actual design.

It should be noted that, in the exemplary embodiment, the first conductive layer D1, the second conductive layer D2, the third conductive layer D3, the fourth conductive layer D4, the fifth conductive layer D5, and the sixth conductive layer MIM may also be called the first metal layer (Metal 1), the second metal layer (Metal 2), the third metal layer (Metal 3), the fourth metal layer (Metal 4), the fifth metal layer (Metal 5) and the sixth metal layer (Metal 6), respectively.

The first conductive layer D1, the second conductive layer D2, the third conductive layer D3, the fourth conductive layer D4, the fifth conductive layer D5, the sixth conductive layer MIM, and the second connecting layer TM2 may use metal materials, such as silver (Ag), copper (Cu), aluminum (Al) or molybdenum (Mo), or the alloy materials composed of metals, such as aluminum neodymium alloy (AlNd) or molybdenum niobium alloy (MoNb), which may be single-layer structure, or may be a multi-layer composite structure, such as a tandem structure composed of Mo layer, Cu layer and Mo layer.

In the exemplary embodiment, the insulation layer between each two adjacent conductive layers may be silicon oxide SiOx, silicon nitride SiNx, Silicon oxynitride SiON, etc., and the insulation layer may be a single-layer structure or a multi-layer composite structure.

In addition, the number of the via holes on the insulation layer or the dielectric layer between the conductive layers in the embodiment of the present disclosure can be determined according to actual needs, and there is no limit here.

In local areas, in order to improve the continuity stability between the connecting lines of different film layers, multiple via holes filled with conductive materials may be set between the same group of conductive structures. The number of the via holes drawn in the drawings provided by the present disclosure does not represent the limit on the number of the via holes, but is only an example.

The shape and layout of multiple via holes are not limited here. In the exemplary embodiment, the plane shape of the via holes may be rectangular, circular or elliptical, and the dimensions of multiple via holes may be the same or different.

Figure 11A:
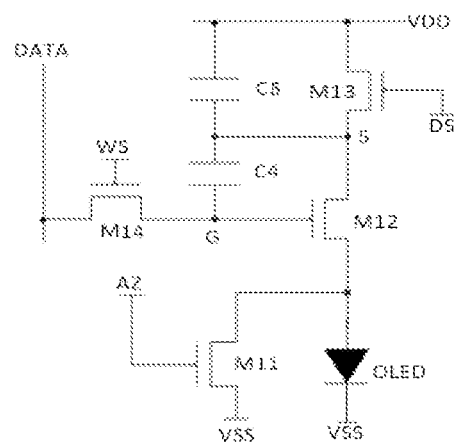
FIG. 11A is a schematic diagram of a circuit structure of a pixel driving unit according to an embodiment of the present disclosure.

In some embodiments of the present disclosure, as shown in FIG. 11A, the pixel driving unit includes an eleventh transistor M11, a twelfth transistor M12, a thirteenth transistor M13, a fourteenth transistor M14, a fourth capacitor C4 and a fifth capacitor C5;

a gate of the eleventh transistor M11 is electrically connected to a reset signal line AZ, a first pole of the eleventh transistor M11 is electrically connected to an anode of a light-emitting device, a second pole of the eleventh transistor M11 is electrically connected to the second power signal line VSS;

a gate of the twelfth transistor M12 is electrically connected to a fourth node G, a first pole of the twelfth transistor M12 is electrically connected to a fifth node S, a second pole of the twelfth transistor M12 is electrically connected to the anode;

a gate of the thirteenth transistor M13 is electrically connected to the light-emitting control signal output line (EOUT or DS), a first pole of the thirteenth transistor M13 is electrically connected to the first power signal line VDD, a second pole of the thirteenth transistor M13 is electrically connected to the fifth node S;

a gate of the fourteenth transistor M14 is electrically connected to a gate drive signal line WS, a first pole of the fourteenth transistor M14 is electrically connected to a data line DATA, a second pole of the fourteenth transistor M14 is electrically connected to the fourth node G; and a first electrode of the fourth capacitor C4 is electrically connected to the fifth node S, a second electrode of the fourth capacitor C4 is electrically connected to the fourth node G; a first electrode of the fifth capacitor C5 is electrically connected to the first power signal line VDD, and a second electrode of the fifth capacitor C5 is electrically connected to the fifth node S.

The specific types of the eleventh transistor M11, the twelfth transistor M12, the thirteenth transistor M13 and the fourteenth transistor M14 are not limited here. For example, it can be a thin film transistor or a field effect transistor; alternatively, it can be an N-type transistor or a P-type transistor.

In the exemplary embodiment, the transistor types of the eleventh transistor M11, the twelfth transistor M12, the thirteenth transistor M13, and the fourteenth transistor M14 are the same as those of the EOA unit in the previous specification to reduce the difficulty of the preparation process.

It should be noted that in FIG. 11A, one end of the mark DS is electrically connected to the light-emitting control signal output line (EOUT1→AA) in the EOA unit. A single EOA unit may periodically and orderly control the on/off state of the thirteenth transistor of the corresponding pixel line, thus controlling the dark/light state of the sub-pixels. Multiple EOA units that are cascaded may generate shift pulses with equal distance between adjacent rows, so as to realize line-by-line refresh and lighting of the display panel prepared by the array base plate.

Figure 11B:
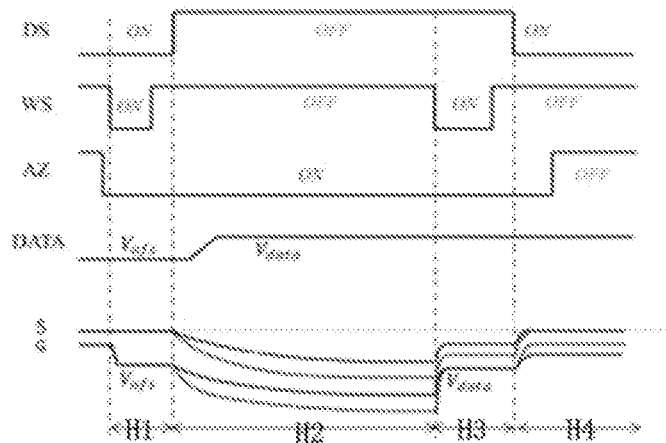
FIG. 11B is a sequence diagram of a working process of the pixel driving unit in FIG. 11A.

FIG. 11B is a working sequence diagram of the pixel drive circuit in FIG. 11A. As shown in FIG. 11B, the working process of the pixel drive circuit includes four stages. It should be noted that in FIG. 12 to FIG. 15, the mark "x" means that the transistor is in the cut-off state, and the mark "√" means that the transistor is in the on-state. In addition, the fourth node and the fifth node in the circuit do not actually exist, which is a concept put forward for the convenience of describing the circuit connection.

Taking the transistors in the pixel drive circuit shown in FIG. 11A being the P-type transistors as an example, the working process of the pixel drive circuit in FIG. 11A is described in combination with FIG. 11B.

Figure 12:
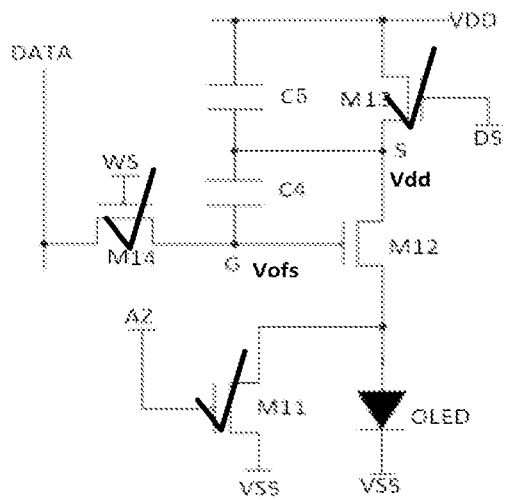
FIG. 12 to FIG. 15 are illustration diagrams of working principles of the pixel driving unit in FIG. 11A under four working stages.

As shown in FIG. 11B, in the first stage H1, inputting a low-level light-emitting control signal to the light-emitting control signal output line (EOUT or DS), inputting a low-level gate drive signal to the gate drive signal line WS, and inputting a low-level reset signal to the reset signal line AZ;

in the first stage H1 (Vofs writing stage), as shown in FIG. 12, the transistors connected to the light-emitting control signal output line (EOUT or DS) receive the low-level light-emitting control signal, the transistors connected to the gate drive signal line WS receive the low-level gate drive signal, the transistors connected to the reset signal line AZ receive the low-level reset signal, the data line DATA receives the Vofs voltage signal, and the eleventh transistor M11 the twelfth transistor M12, the thirteenth transistor M13 and the fourteenth transistor M14 are on, the fourth node G writes the voltage value of Vofs, and the fifth node S writes the voltage value of Vdd.

Figure 13:
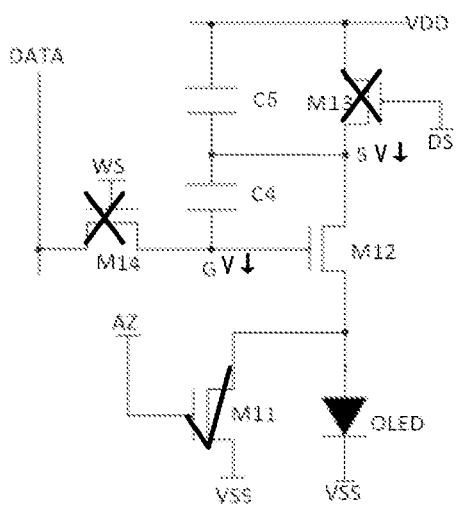

As shown in FIG. 11B, in the second stage H2, inputting a high-level light-emitting control signal to the light-emitting control signal output line (EOUT or DS), inputting a high-level gate drive signal to the gate drive signal line WS, and inputting a low-level reset signal to the reset signal line AZ;

in the second stage H2 (self-compensation stage), as shown in FIG. 13, the transistors connected to the light-emitting control signal output line (EOUT or DS) receive the high level light-emitting control signal, the transistors connected to the gate drive signal line WS receive the high-level gate drive signal, the transistors connected to the reset signal line AZ receive the low-level reset signal, and the eleventh transistor M11 is on, the thirteenth transistor M13 and fourteenth transistor M14 are cut-off, and the voltages at the fourth node G and the fifth node S begins to drop, until the voltage difference between the fourth node G and the fifth node S is equal to the threshold voltage (Vth) of the twelfth transistor M12, and the twelfth transistor M12 is cut-off.

Figure 14:
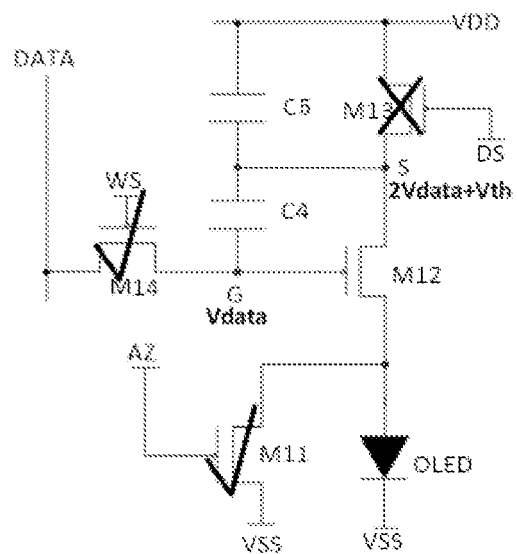

As shown in FIG. 11B, in the third stage H3, inputting a high-level light-emitting control signal to the light-emitting control signal output line (EOUT or DS), inputting a low-level gate drive signal to the gate drive signal line WS, and inputting a low-level reset signal to the reset signal line AZ;

in the third stage H3 (DATA writing stage), as shown in FIG. 14, the transistors connected to the light-emitting control signal output line (EOUT or DS) receive the high-level light-emitting control signal, the transistors connected to the gate drive signal line VS receive the low-level gate drive signal, the transistors connected to the reset signal line AZ receive the low-level reset signal, the eleventh transistor M11 and the fourteenth transistor M14 are on, and the thirteenth transistor M13 is cut-off. At this time, the voltage at the fourth node G is Vdata, the voltage at the fifth node S is 2Vdata+Vth. and the difference between the voltage at the fourth node G and the voltage at the fifth node S is Vdata+Vth.

Figure 15:
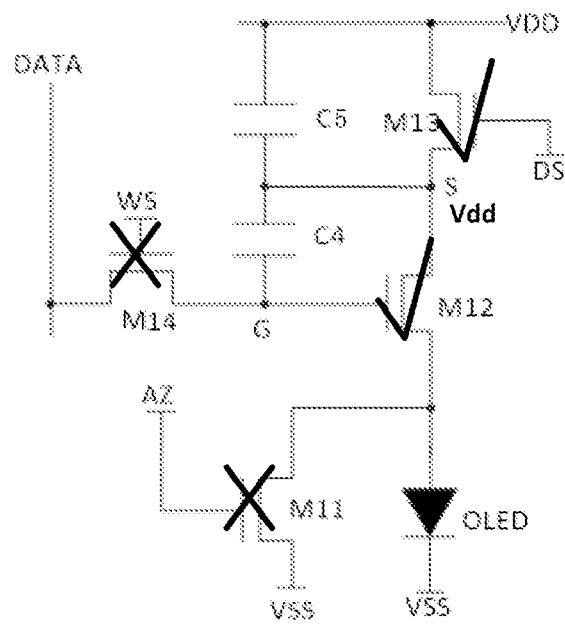

As shown in FIG. 11B, in the fourth stage H4, inputting the low-level light-emitting control signal to the light-emitting control signal output line (EOUT or DS), inputting the high-level gate drive signal to the gate drive signal line WS, and inputting a high-level reset signal to the reset signal line AZ;

in the fourth stage H4 (light emitting phase), as shown in FIG. 15, the transistors connected to the light-emitting control signal output line (EOUT or DS) receive the low-level light-emitting control signal, the transistors connected to the gate drive signal line WS receive the high-level gate drive signal, the transistors connected to the reset signal line AZ receive the high-level reset signal, the eleventh transistor M11 and the fourteenth transistor M14 are cut-off, the twelfth transistor M12 and the thirteenth transistor M13 are on, the voltage at the fifth node S is Vdd, the difference between the voltage at the fourth node G and the voltage at the second node S is a function of Vdata, and which is independent of the threshold voltage Vth of the twelfth transistor M12. At this time, the pixel driver circuit drives the light-emitting device to emit light.

It should be noted that, in practical applications, the transistors in the above pixel drive circuit may also be the N-type transistors. When the above transistors are the N-type transistors, the signal sequence diagram of the circuit is opposite to the sequence signal in FIG. 11B.

In the exemplary embodiment, the light-emitting device electrically connected to the pixel drive circuit described above may be a light-emitting diode or the like. The light-emitting diode may be an organic light-emitting diode (OLED) or a quantum dot light-emitting diode (QLED), and so on.

The array base plate provided by the embodiment of the present disclosure may also include an anode, a pixel definition layer, an organic light-emitting layer, a cathode, a first encapsulation layer, a color-film structure layer and second encapsulation layer. For details, please refer to the related art, which will not be repeated here.

Figure 39:
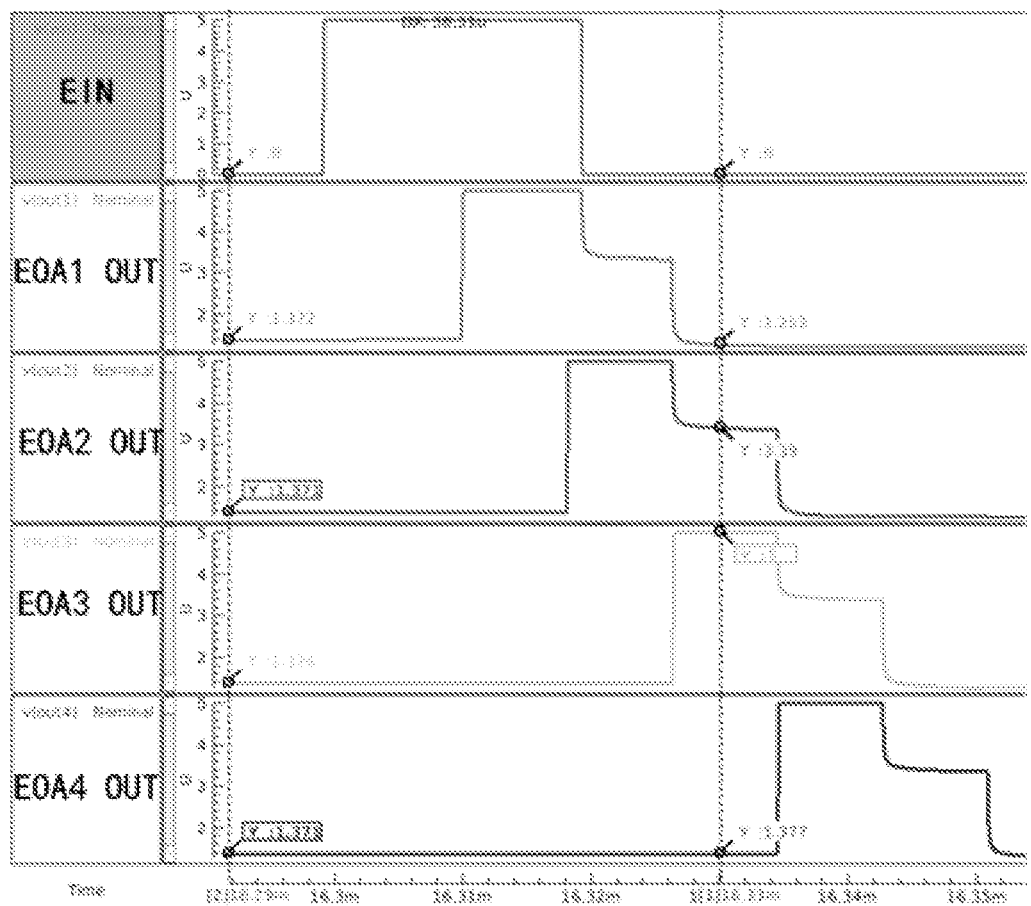
FIG. 39 is output signal simulates data of an EOA unit of an array base plate according to an embodiment of the present disclosure.

As shown in FIG. 39, under the condition of 60 Hz refresh rate and based on the process conditions of SMIC11 (i.e., 110 nm process), the array base plate provided by the embodiment of the present disclosure is used to simulate the circuit output signal (EOUT), and the output signals of the EOA units at all levels are obtained as shown in FIG. 36. The output signal has two voltage values at high-level (two steps shown in FIG. 36), but it can fully meet the control of the electrical signal in the on and cut-off state of the thirteenth transistor M13 in the pixel drive circuit. In addition, it should be noted that the EOA circuit provided by the embodiment of the present disclosure has good driving ability, may overcome the parasitic capacitance of up to 20 pF in a line of sub-pixels corresponding to the EOA unit, and may overcome the load resistance of up to 20 kΩ in the line of sub-pixels corresponding to the EOA unit. That is to say, the EOA circuit can still drive normally when there is the parasitic capacitance up to 20 pF in the circuit, and the EOA circuit can still drive normally when there is the load resistance up to 20 kΩ in the circuit.

In addition, by adopting the design layout of the EOA circuit provided by the embodiment of the present disclosure, a new design of the EOA circuit on the array base plate based on the silicon substrate is provided, its EOA circuit signal is stable, and the EOA circuit occupies a small design space in the peripheral area, which is conducive to the preparation of narrow frame silicon-based display products. According to calculation, the size of the design space occupied by the EOA circuit provided by the embodiment of the present disclosure along the direction that the peripheral area points to the display area is less than or equal to 52.25 μm.

The embodiment of the present disclosure provides a display panel, including the array base plate as described above.

Because the display panel provided by the embodiment of the present disclosure includes the array base plate described above, the beneficial effects of the display panel may refer to the beneficial effects of the array base plate mentioned above, which will not be repeated here.

The embodiment of the present disclosure provides a display device, including the display panel as described above.

In the exemplary embodiment, the display device of the present disclosure may include but not limited to the OLED display device or the QLED display device, and may be used for virtual reality devices or augmented reality devices, and so on. The display device may include but not be limited to: mobile phones, tablets, televisions, displays, laptops, digital photo frames, navigators or any products or components with display functions.

In the exemplary embodiment, the array base plate of the silicon substrate in the display device can make the pixel drive circuit array, the source driver, the gate driver, the emission control driver (i.e., the EOA unit in the present disclosure), the oscillator (OSC), the Gamma register and display control module to be integrated on the same chip using integrated circuits. The pixel driver circuit, the source driver, the gate driver, the emission control driver and other parts are analog circuit modules, while the Gamma register, the interface and the display control module are mainly digital modules, the array base plate with the silicon substrate integrated with the digital modules and analog modules is a typical system on chip (SOC). Because the analog circuit modules and digital circuit modules are mixed on the same chip (One Chip technology), the manufacturing process node of the chip is determined by the digital circuit modules with higher requirements in the two parts of the analog circuit modules and the digital circuit modules.

For example, the array base plate with the silicon substrate using the One Chip technology can be prepared using the integrated circuit manufacturing process less than 0.11 um or 55 nm. In practical applications, because of the high cost of the One Chip technology, the One Chip technology is usually used in small-scale display products, such as virtual reality (VR) or augmented reality (AR) near-eye display field.

In the exemplary embodiment, the array base plate with the silicon substrate can also separate the analog circuit part such as the pixel drive circuit array, the source driver, the gate driver, and the emission control driver (i.e., the EOA unit of the present disclosure) from the OSC, the Gamma register, the interface, and the display control module, and the One Chip technology is changed to a Two Chip technology. Among them, the size of the analog circuit part is determined by the size of the display area of the silicon-based micro-display, but its manufacturing process requirements are low, and the cost of this part may be reduced by using low process. Because of separating from the digital circuit part, its size is smaller than that of the One Chip mode, and the cost may be further reduced. The digital circuit part mainly includes the OSC, the Gamma register, the interface and the display control module. The size of this part is small, and this part may be prepared by using high process technology matching with the circuit manufacturing requirements. This is the so-called Two Chip mode. The Two Chip mode adopts the mode of separating the display panel (Panel) and the display driver integrated chip (DDIC). OLED devices are processed on the Panel, after processing and testing, the finished products that can be normally displayed and the DDIC are bonded together through chip on FPC (COF) or chip on chip (COC), and finally form a controllable silicon-based micro-display device.

The above is only the specific implementation of the present disclosure, but the protection scope of the present disclosure is not limited to this. Any technical personnel familiar with the technical field can easily think of changes or replacements within the scope of technology disclosed in the present disclosure, which should be covered in the protection scope of the present disclosure. Therefore, the protection scope of the present disclosure shall be subject to the protection scope of the claims.

The invention claimed is:

1. An array base plate, comprising:
a silicon substrate, wherein the silicon substrate comprises a display area and a peripheral area located on at least one side of the display area, a plurality of EOA units that are cascaded and disposed at the peripheral area, and a plurality of sub-pixels disposed at the display area; at least one of the plurality of sub-pixels comprises a pixel driving unit, the EOA units are electrically connected to the pixel driving unit, and each of the plurality of EOA units comprises:
an input circuit, wherein the input circuit is electrically connected to a light-emitting control signal input line and a first clock signal line, and the input circuit is configured to transmit a signal input by the light-emitting control signal input line to the EOA unit under the control of the first clock signal input by the first clock signal line;
a first control circuit, wherein the first control circuit is electrically connected to the input circuit, the first clock signal line, a second clock signal line, a first node, a second node, a first power signal line and a second power signal line, the first control circuit is configured to transmit a second power signal input by the second power signal line to the first node under the control of the first clock signal, and is further configured to transmit a first power signal input by the first power signal line to the second node under the joint control of a signal of the first node and a second clock signal input by the second clock signal line;
a second control circuit, wherein the second control circuit is electrically connected to the first power signal line, the first node, the second node, the second clock signal line and a third node, the second control circuit is configured to transmit the second clock signal to the third node under the joint control of a signal of the first node and the second clock signal; the second control circuit is further configured to transmit the second power signal to the third node under the control of a signal of the second node;
a pull-up circuit, wherein the pull-up circuit is electrically connected to the first control circuit, the second control circuit, a light-emitting control signal output line and the third node, and the pull-up circuit is configured to transmit the first power signal to the light-emitting control signal output line under the control of a signal of the third node; and
a pull-down circuit, wherein the pull-down circuit is electrically connected to the first control circuit, the second control circuit, the second clock signal line, the light-emitting control signal output line and the second node, and the pull-down circuit is configured to transmit the second power signal to the light-emitting control signal output line under the control of the signal of the second node.

2. The array base plate according to claim 1, wherein the input circuit comprises a first transistor, the first control circuit comprises a second transistor, a third transistor, a fourth transistor and a fifth transistor;
a gate of the first transistor is electrically connected to the first clock signal line, a first pole of the first transistor is electrically connected to the second node, a second pole of the first transistor is electrically connected to the light-emitting control signal input line;
a gate of the second transistor is electrically connected to the second node, a first pole of the second transistor is electrically connected to the first clock signal line, a second pole of the second transistor is electrically connected to the first node;
a gate of the third transistor is electrically connected to the first clock signal line, a first pole of the third transistor is electrically connected to the first node, a second pole of the third transistor is electrically connected to the second power signal line;
a gate of the fourth transistor is electrically connected to the first node, a first pole of the fourth transistor is electrically connected to the first power signal line, a second pole of the fourth transistor is electrically connected to a first pole of the fifth transistor; and
a gate of the fifth transistor is electrically connected to the second clock signal line, a second pole of the fifth transistor is electrically connected to the second node.

3. The array base plate according to claim 2, wherein the second control circuit comprises a sixth transistor, a seventh transistor, an eighth transistor and a first capacitor;
a gate of the sixth transistor is electrically connected to the second node, a first pole of the sixth transistor is electrically connected to the first power signal line, a second pole of the sixth transistor is electrically connected to the third node;
a gate of the seventh transistor is electrically connected to the second clock signal line, a first pole of the seventh transistor is electrically connected to the third node, a second pole of the seventh transistor is electrically connected to a first pole of the eighth transistor;
a gate of the eighth transistor is electrically connected to the first node, a second pole of the eighth transistor is electrically connected to the second clock signal line; and
a first electrode of the first capacitor is electrically connected to the first pole of the eighth transistor, a second electrode of the first capacitor is electrically connected to the gate of the eighth transistor.

4. The array base plate according to claim 3, wherein the pull-up circuit comprises a ninth transistor and a third capacitor, the pull-down circuit comprises a tenth transistor and a second capacitor;
a gate of the ninth transistor is electrically connected to the third node, a first pole of the ninth transistor is electrically connected to the first power signal line, a second pole of the ninth transistor is electrically connected to the light-emitting control signal output line; a first electrode of the third capacitor is electrically connected to the first pole of the ninth transistor, a second electrode of the third capacitor is electrically connected to the gate of the ninth transistor; and a gate of the tenth transistor is electrically connected to the second node, a first pole of the tenth transistor is electrically connected to the light-emitting control signal output line, a second pole of the tenth transistor electrically connected to the second power signal line; a first electrode of the second capacitor is electrically connected to the gate of the tenth transistor, a second electrode of the second capacitor is electrically connected to the second clock signal line.

5. The array base plate according to claim 4, wherein the first capacitor, the second capacitor and the third capacitor are disposed in a same layer; each capacitor is located at a side of each transistor away from the silicon substrate;

wherein, an orthographic projection of the first capacitor on the silicon substrate overlaps an orthographic projection of the tenth transistor on the silicon substrate; an orthographic projection of the second capacitor on the silicon substrate partially overlaps the orthographic projection of the tenth transistor on the silicon substrate, the orthographic projection of the second capacitor on the silicon substrate partially overlaps an orthographic projection of the ninth transistor on the silicon substrate; an orthographic projection of the third capacitor on the silicon substrate partially overlaps the orthographic projection of the ninth transistor on the silicon substrate.

6. The array base plate according to claim 4, wherein each of the plurality of EOA units further comprises a forward scan transistor and a reverse sweep transistor; the array base plate further comprises a forward scan control signal line and a reverse sweep control signal line, a gate of the forward scan transistor is electrically connected to the forward scan control signal line, a gate of the reverse sweep transistor is electrically connected to the reverse sweep control signal line;

a first pole of the forward scan transistor of the EOA unit at a n-th level is electrically connected to the second pole of the first transistor of the EOA unit at a (n+1)-th level, a second pole of the forward scan transistor of the EOA unit at the n-th level is electrically connected to the forward scan signal output line of the EOA unit at the n-th level; and a first pole of the reverse sweep transistor of the EOA unit at the n-th level is electrically connected to the reverse sweep signal output line of the EOA unit at the (n+1)-th level, a second pole of the reverse sweep transistor of the EOA unit at the n-th level is electrically connected to the second pole of the first transistor of the EOA unit at the n-th level.

7. The array base plate according to claim 6, wherein the array base plate comprises a power interface between the forward scan transistor and the reverse sweep transistor, and the power interface is configured to electrically connect the first power signal line and the silicon substrate.

8. The array base plate according to claim 7, wherein the first pole of the first transistor is shared with the second pole of the fifth transistor, the second pole of the second transistor is shared with the first pole of the third transistor, the first pole of the fourth transistor is shared with the first pole of the sixth transistor, and the second pole of the seventh transistor is shared with the first pole of the eighth transistor.

9. The array base plate according to claim 8, wherein the array base plate comprises a semiconductor layer located on the silicon substrate, the semiconductor layer comprises an active region, a source region, and a drain region of each transistor of the EOA unit and a first sublayer of the power interface;

the semiconductor layer comprises a first portion, a second portion, a third portion, a fourth portion, a fifth portion, a sixth portion, a seventh portion, an eighth portion and a ninth portion that are disposed at intervals with each other;

a connecting line of geometric centers of the first portion and the second portion, a connecting line of geometric centers of the third portion and the fourth portion, and a connecting line of geometric centers of the fifth portion, the sixth portion and the seventh portion are parallel; the fifth portion is located at a side of the third portion away from the first portion, the seventh portion is located at a side of the fourth portion away from the second portion, the sixth portion is located between the fifth portion and the seventh portion; and the ninth portion is located at a side of the eighth portion away from the sixth portion;

the first portion comprises the active regions, the source regions and the drain regions of the first transistor and the fifth transistor, the second portion comprises the active regions, the source regions and the drain regions of the fourth transistor and the sixth transistor, the third portion comprises the active regions, the source regions and the drain regions of the second transistor and the third transistor, the fourth portion comprises the active regions, the source regions and the drain regions of the seventh transistor and the eighth transistor; and the fifth portion comprises the active region, the source region and the drain region of the reverse sweep transistor, the sixth portion comprises the first sublayer of the power interface, the seventh portion comprises the active region, the source region and the drain region of the forward scan transistor; the eighth portion comprises the active region, the source region and the drain region of the tenth transistor, and the ninth portion comprises the active region, the source region and the drain region of the ninth transistor.

10. The array base plate according to claim 9, wherein an area of an orthographic projection of the eighth portion of the semiconductor layer on the silicon substrate is equal to an area of an orthographic projection of the ninth portion on the silicon substrate, and is greater than areas of orthographic projections of the other portions on the silicon substrate.

11. The array base plate according to claim 10, wherein the array base plate further comprises a gate layer located at a side of the semiconductor layer away from the silicon substrate;

the gate layer comprises the gate of each transistor, an orthographic projection of the gate layer on the silicon substrate partially overlaps an orthographic projection of the semiconductor layer on the silicon substrate; a region of the semiconductor layer overlapping the orthographic projection of the gate layer on the silicon substrate is the active region of each transistor, and a region of the semiconductor layer not overlapping the orthographic projection of the gate layer on the silicon substrate is the source region or the drain region of each transistor;

wherein, the gate of the ninth transistor and the gate of the tenth transistor comprise a first gate part and four second gate parts, respectively, the second gate parts are disposed at intervals and extend along a same direction, and the four second gate parts are connected in parallel through the first gate part.

12. The array base plate according to claim 11, wherein the tenth transistor comprises a first sub-transistor, a second sub-transistor, a third sub-transistor and a fourth sub-transistor that are disposed in parallel;

the ninth transistor comprises a fifth sub-transistor, a sixth sub-transistor, a seventh sub-transistor and an eighth sub-transistor that are disposed in parallel, each second gate part is regarded as the gate of each sub-transistor;

the eighth portion of the semiconductor layer comprises the active regions, the source regions and the drain regions of the first sub-transistor, the second sub-transistor, the third sub-transistor and the fourth sub-transistor;

the ninth portion of the semiconductor layer comprises the active regions, the source regions and the drain regions of the fifth sub-transistor, the sixth sub-transistor, the seventh sub-transistor and the eighth sub-transistor;

wherein, the source regions of the sub-transistors of the ninth transistor are connected in parallel, the drain regions of the sub-transistors of the ninth transistor are connected in parallel; the source regions of the sub-transistors of the tenth transistor are connected in parallel, the drain regions of the sub-transistors of the tenth transistor are connected in parallel.

13. The array base plate according to claim 12, wherein an area of an orthographic projection of the second gate part on the silicon substrate is greater than an area of an orthographic projection of any one of the gates of the transistors except the gate of the ninth transistor and the gate of the tenth transistor on the silicon substrate.

14. The array base plate according to claim 12, wherein the drain region of the first sub-transistor is shared with the drain region of the second sub-transistor, the source region of the second sub-transistor is shared with the source region of the third sub-transistor, and the drain region of the third sub-transistor is shared with the drain region of the fourth sub-transistor; and the drain region of the fifth sub-transistor is shared with the drain region of the sixth sub-transistor, the source region of the sixth sub-transistor is shared with the source region of the seventh sub-transistor, and the drain region of the seventh sub-transistor is shared with the drain region of the eighth sub-transistor.

15. The array base plate according to claim 14, wherein the array base plate further comprises a first conductive layer located at a side of the gate layer away from the silicon substrate;

the first conductive layer comprises a first connecting part of which an orthographic projection on the silicon substrate overlapping the source region of each transistor, a second connecting part of which an orthographic projection on the silicon substrate overlapping the drain region of each transistor, and a third connecting part of which an orthographic projection on the silicon substrate overlapping the gate of each transistor; and the first connecting part of each transistor is electrically connected to the source region, the second connecting part of each transistor is electrically connected to the drain region, and the third connecting part of each transistor is electrically connected to the gate.

16. The array base plate according to claim 15, wherein the first connecting part of the sixth transistor and the first connecting part of the seventh transistor are an integrated structure, and is connected to the third connecting part of the ninth transistor; the second connecting part of the fourth transistor is electrically connected to the first connecting part of the fifth transistor.

17. The array base plate according to claim 16, wherein the first conductive layer further comprises a second sublayer of the power interface, an orthographic projection of the first sublayer of the power interface on the silicon substrate is within an orthographic projection of the second sublayer of the power interface on the silicon substrate, and the first sublayer and the second sublayer are electrically connected.

18. The array base plate according to claim 17, wherein the array base plate further comprises a second conductive layer located at a side of the first conductive layer away from the silicon substrate;

the second conductive layer comprises a forward scan auxiliary line, a reverse sweep auxiliary line, a first power auxiliary line, a second power auxiliary line, a first clock auxiliary line and a second clock auxiliary line with a same extension direction;

the forward scan auxiliary line is electrically connected to the gate of the forward scan transistor and the forward scan control signal line, the reverse sweep auxiliary line is electrically connected to the gate of the reverse sweep transistor and the reverse sweep control signal line; and the first power auxiliary line is electrically connected to the source region of the ninth transistor and the second sublayer of the power interface, the second power auxiliary line is electrically connected to the source region of the tenth transistor, the first clock auxiliary line is electrically connected to the gate of the first transistor, and the second clock auxiliary line is electrically connected to the second capacitor.

19. A display panel, comprising the array base plate according to claim 1.

20. A display device, comprising the display panel according to claim 19.

* * * * *